United States Patent
Barclay et al.

(10) Patent No.: US 12,089,403 B2
(45) Date of Patent: Sep. 10, 2024

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Lodestar Licensing Group LLC, Evanston, IL (US)

(72) Inventors: M. Jared Barclay, Middleton, ID (US); Merri L. Carlson, Boise, ID (US); Saurabh Keshav, Boise, ID (US); George Matamis, Eagle, ID (US); Young Joon Moon, Boise, ID (US); Kunal R. Parekh, Boise, ID (US); Paolo Tessariol, Arcore (IT); Vinayak Shamanna, Boise, ID (US)

( * ) Notice: Subject to any disclaimer, the term of this patent is extended or adjusted under 35 U.S.C. 154(b) by 138 days.

(21) Appl. No.: 17/590,266

(22) Filed: Feb. 1, 2022

(65) Prior Publication Data
US 2022/0157844 A1 May 19, 2022

Related U.S. Application Data

(62) Division of application No. 16/382,932, filed on Apr. 12, 2019, now Pat. No. 11,271,002.

(51) Int. Cl.
*H10B 41/27* (2023.01)
*H01L 21/311* (2006.01)
(Continued)

(52) U.S. Cl.
CPC ........ *H10B 41/27* (2023.02); *H01L 21/31144* (2013.01); *H10B 41/10* (2023.02); *H10B 43/10* (2023.02); *H10B 43/27* (2023.02)

(58) Field of Classification Search
CPC ......... H01L 27/11556; H01L 27/11519; H01L 21/31144; H01L 27/11582;
(Continued)

(56) References Cited

U.S. PATENT DOCUMENTS

| 8,078,797 B2 | 12/2011 | Estakhri et al. | |
| 8,797,806 B2 * | 8/2014 | Goda | G11C 16/12 365/185.26 |

(Continued)

FOREIGN PATENT DOCUMENTS

| WO | WO 2018004749 | 1/2018 |
| WO | WO PCT/US2020/020025 | 9/2021 |

OTHER PUBLICATIONS

Micheloni et al., "2 NAND overview: from memory to systems", Springer Science+Business Media B.V., 2010, Germany, pp. 19-53.
(Continued)

*Primary Examiner* — Earl N Taylor
(74) *Attorney, Agent, or Firm* — Brooks, Cameron & Huebsch, PLLC

(57) ABSTRACT

A method used in forming a memory array comprising strings of memory cells comprises forming a construction comprising a stack that have vertically-alternating insulative tiers and wordline tiers. An array of openings is formed in an uppermost portion of upper material that is above the stack, and the openings comprise channel openings and dummy openings. At least the uppermost portion of the upper material is used as a mask while etching the channel openings and the dummy openings into a lower portion of the upper material. The channel openings are etched into the insulative and wordline tiers. The channel openings are etched deeper into the construction than the dummy openings, and channel material is formed in the channel openings
(Continued)

after the etching. Structures independent of method are disclosed.

14 Claims, 27 Drawing Sheets

(51) Int. Cl.
*H10B 41/10* (2023.01)
*H10B 43/10* (2023.01)
*H10B 43/27* (2023.01)

(58) Field of Classification Search
CPC ... H01L 27/11565; H10B 41/27; H10B 41/10; H10B 43/10; H10B 43/27
See application file for complete search history.

(56) References Cited

U.S. PATENT DOCUMENTS

| | | | |
|---|---|---|---|
| 8,891,305 B2 | 11/2014 | Tanzawa | |
| 9,177,613 B2* | 11/2015 | Lee | H10B 41/27 |
| 9,299,439 B2 | 3/2016 | Ghodsi | |
| 9,779,791 B2 | 10/2017 | Tanzawa | |
| 2014/0063890 A1* | 3/2014 | Lee | G11C 5/063 |
| | | | 257/773 |
| 2015/0001460 A1* | 1/2015 | Kim | H10B 43/20 |
| | | | 257/5 |
| 2015/0228659 A1 | 8/2015 | Vu et al. | |
| 2016/0079185 A1* | 3/2016 | Kato | H10B 43/27 |
| | | | 257/314 |
| 2016/0104718 A1 | 4/2016 | Omura et al. | |
| 2016/0240547 A1* | 8/2016 | Tagami | H10B 43/27 |
| 2016/0267984 A1 | 9/2016 | Tanzawa | |
| 2016/0276353 A1* | 9/2016 | Kobayashi | H10B 43/27 |
| 2017/0040337 A1* | 2/2017 | Kim | H10B 41/27 |
| 2017/0062067 A1 | 3/2017 | Yang et al. | |
| 2017/0098658 A1* | 4/2017 | Matsuda | H10B 41/10 |
| 2018/0226427 A1 | 8/2018 | Huang et al. | |
| 2018/0247949 A1 | 8/2018 | Choi | |
| 2018/0277556 A1* | 9/2018 | Kang | H10B 43/10 |
| 2019/0043881 A1* | 2/2019 | Kim | H01L 29/6681 |
| 2019/0081061 A1 | 3/2019 | Tessariol et al. | |
| 2019/0088671 A1 | 3/2019 | Greenlee et al. | |

OTHER PUBLICATIONS

Novotny et al., "NAND Flash Memory Organization and Operations", Journal of Information Technology & Software Engineering 5:139, 2015, pp. 1-8.
Parnell, "NAND Flash Basics & Error Characteristics, Why Do We Need Smart Controllers?" Flash Memory Summit 2016, Santa Clara, CA, pp. 1-20.

* cited by examiner

MEMORY ARRAYS COMPRISING STRINGS OF MEMORY CELLS AND METHODS USED IN FORMING A MEMORY ARRAY COMPRISING STRINGS OF MEMORY CELLS

This patent resulted from a divisional application of U.S. patent application Ser. No. 16/382,932, filed Apr. 12, 2019, entitled "Methods Used In Forming A Memory Array Comprising Strings Of Memory Cells", naming M. Jared Barclay, Merri L. Carlson, Saurabh Keshav, George Matamis, Young Joon Moon, Kunal R. Parekh, Paolo Tessariol, and Vinayak Shamanna as inventors, the disclosure of which is incorporated by reference.

TECHNICAL FIELD

Embodiments disclosed herein pertain to memory arrays comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory blocks and partial blocks (e.g., sub-blocks), for example as shown and described in any of U.S. Patent Application Publication Nos. 2015/0228659, 2016/0267984, and 2017/0140833, and which are hereby and herein fully incorporated by reference and aspects of which may be used in some embodiments of the inventions disclosed herein.

DETAILED DESCRIPTION OF EXAMPLE EMBODIMENTS

Embodiments of the invention encompass methods used in forming an array of transistors and/or memory comprising memory cells (e.g., in strings), for example an array of NAND or other memory cells having peripheral control circuitry under the array (e.g., CMOS under-array). Embodiments of the invention encompass so-called "gate-last" or "replacement-gate" processing, so-called "gate-first" processing, and other processing whether existing or future-developed independent of when transistor gates are formed. Embodiments of the invention also encompass an array of transistors and/or memory cells (e.g., NAND or other memory cells) independent of method of manufacture. First example method embodiments are described with reference to FIGS. 1-24 which may be considered as a "gate-last" or "replacement-gate" process.

Figure 1:
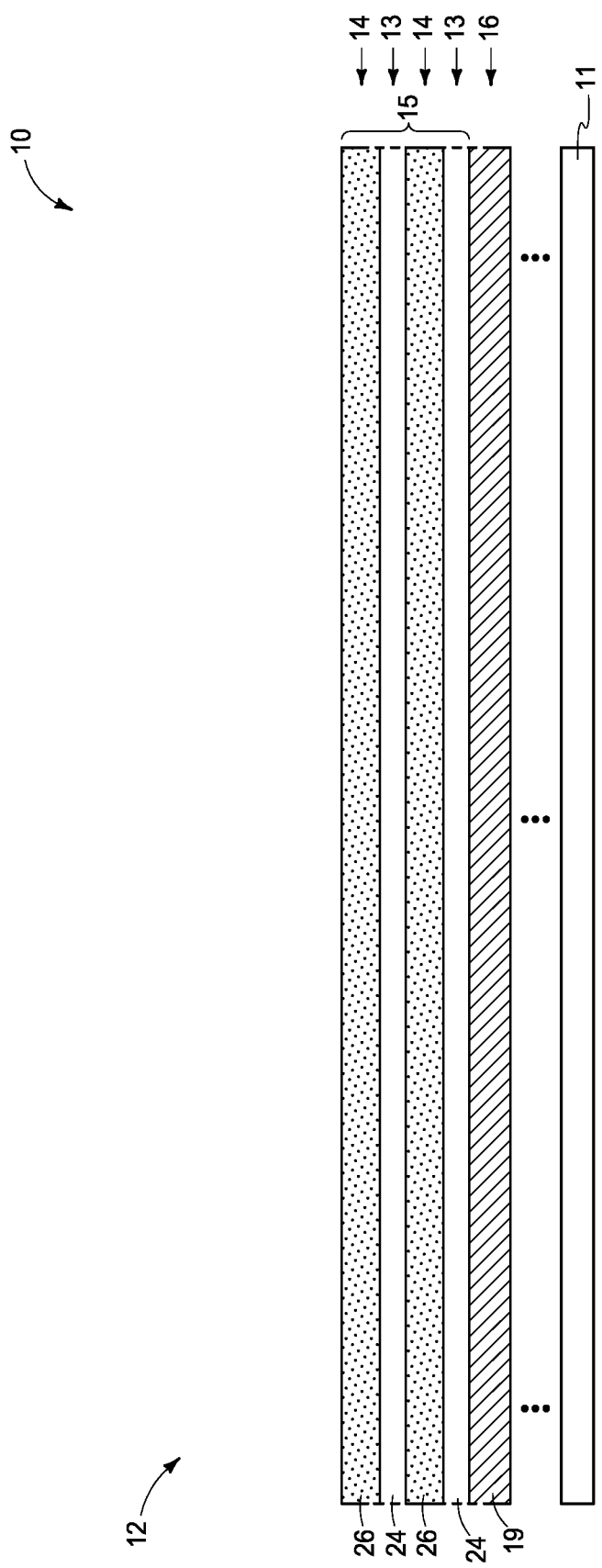
FIG. 1 is a diagrammatic cross-sectional view of a portion of a substrate in process in accordance with an embodiment of the invention.

FIG. 1 shows a construction 10 in a method of forming an array 12 of elevationally-extending strings of transistors and/or memory cells (not yet shown). Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIG. 1-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

Substrate/construction 10 comprises a conductive tier 16. Example conductive tier 16 is shown as comprising conductive material 19 (e.g., conductively-doped semiconductive material such as conductively-doped polysilicon above metal material such as $WSi_x$). Conductive tier 16 may comprise part of control circuitry (e.g., peripheral-under-array circuitry) used to control read and write access to the transistors and/or memory cells that will be formed within array 12.

In one embodiment, a lower select gate tier is formed above conductive tier 16. FIG. 1 by way of example shows two lower select gate tiers 14 separated by an insulating tier 13 as part of a stack 15. Example thickness for tiers 13 and 14 is 22 to 60 nanometers. More or fewer tiers 13, 14 may be formed. Lower select gate tiers 14 will ultimately comprise one or more select gates, and in one embodiment one or more source select gates (individually commonly referred to as a select gate source [SGS]). A select gate tier may not comprise conductive material at this point in processing and where multiple select gate tiers are present, some may be conductive and some may be insulative at this point in the processing. Further, two or more of multiple select gates in stack 15 (not yet shown) may be directly electrically coupled, or otherwise electrically coupled, relative one another in a finished circuitry construction. Lower select gate tiers 14 are shown as comprising material 26 and insulating tiers 13 are shown as comprising insulative material 24, and one or both of which may be wholly or partially sacrificial. An example material 24 is silicon dioxide and an example material 26 is silicon nitride in conjunction with the hereby initially-described example method embodiment which is "gate-last" or "replacement-gate".

Figure 2:
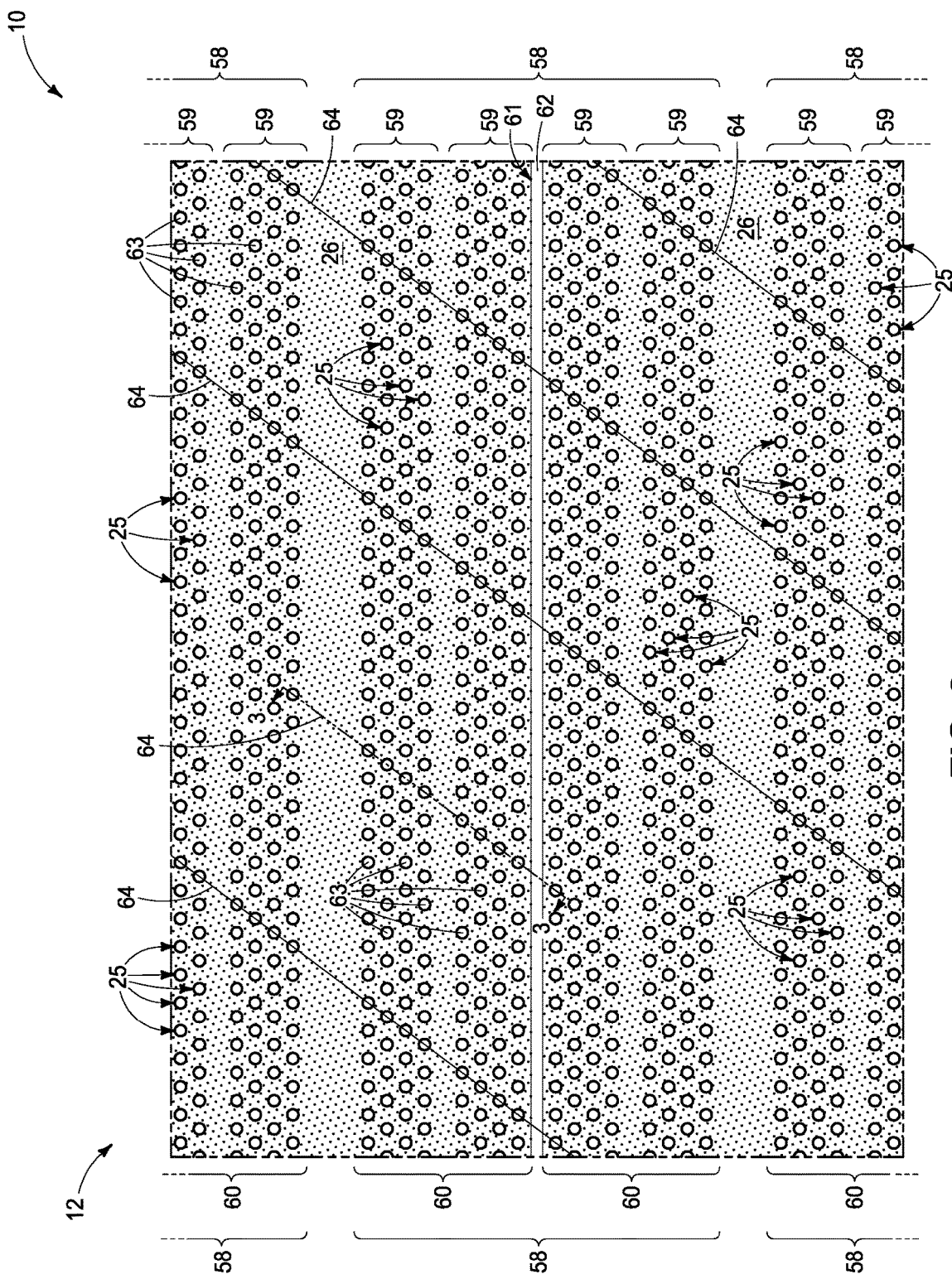
FIGS. 2-24 are diagrammatic sequential sectional and/or enlarged views of the construction of FIG. 1 in process in accordance with some embodiments of the invention.
Figure 3:
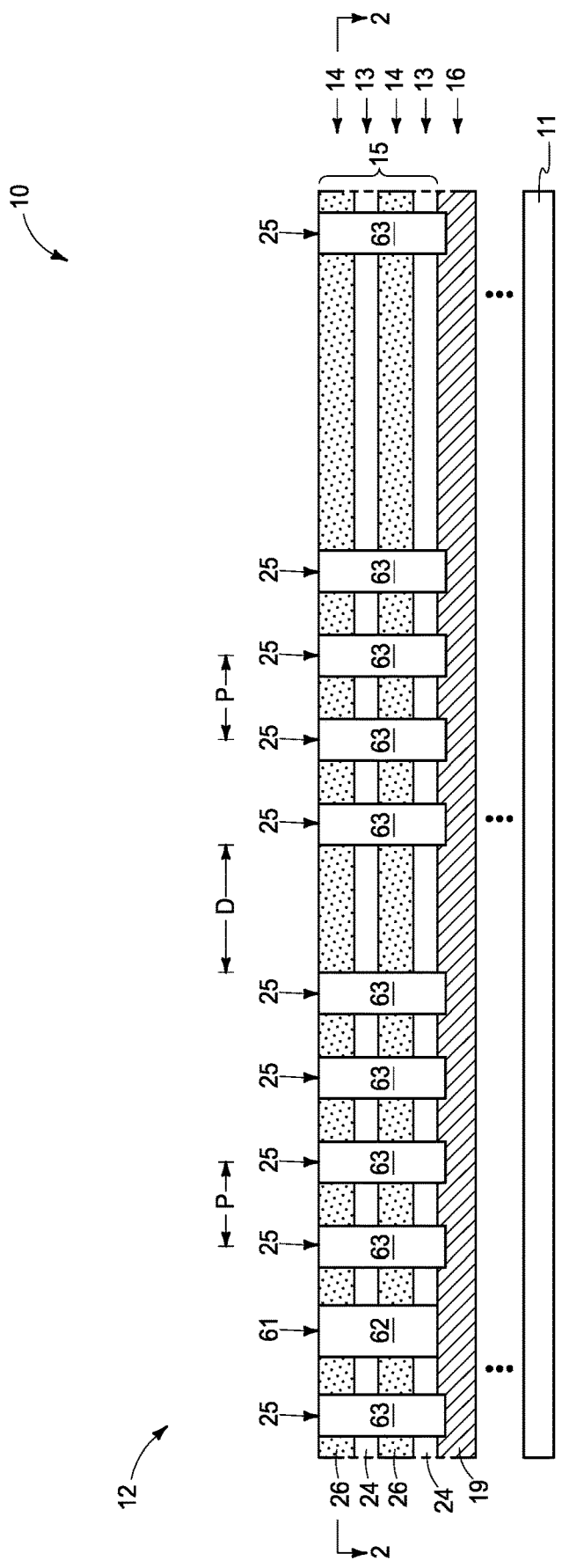

Referring to FIGS. 2 and 3, channel openings 25 have been formed through stack 15 to conductive tier 16. Such are shown within memory array 12 as being arrayed in laterally-spaced memory blocks 58 that individually comprise sub-blocks 59. In one embodiment, individual memory blocks 58 comprise a lower select gate in a finished circuitry construction, example locations of which are designated with numeral 60. In one embodiment and as shown, construction 10 comprises multiple lower select gates 60 in individual memory blocks 58 in the finished circuitry construction. Example array 12 is shown as comprising four sub-blocks 59 per memory block 58 and four diagonal rows or columns of channel openings 25 diagonally horizontally across individual sub-blocks 59. Alternate constructions and numbers of sub-blocks and channel openings may be used. Additionally, example array 12 is shown as comprising two lower select gates 60 in a finished circuitry construction in a single memory block 58, with lower select gates 60 being laterally spaced relative one another by an isolation structure 61 comprising material 62 (e.g., an insulator material such as silicon dioxide and/or silicon nitride). Openings within which isolation structures 61 are formed may be formed at the same time or at different times as forming channel openings 25. Additionally, channel openings 25 need not be formed at this point in the process. In one embodiment, channel openings 25 comprise etch-stop material 63 (e.g., aluminum oxide and/or doped silicon dioxide). In one embodiment and as shown, channel openings 25 have a common horizontal pitch P within individual sub-blocks 59 (at least intra-sub-block; FIG. 3) along parallel horizontally-straight lines between longitudinal edges of individual memory blocks 58, for example along parallel horizontally-straight diagonal lines 64, with only four full such lines 64 being shown for clarity in FIG. 2. In one embodiment and as shown, channel openings 25 along parallel horizontally-straight lines 64 are horizontally spaced from one another between immediately-adjacent (neighboring) sub-blocks 59 by a distance D that is greater than common horizontal pitch P. Horizontal pitch P may be the same in all sub-blocks 59 as shown (i.e., same pitch P inter-sub-block). Alternately, horizontal pitch P may not be the same in all of the sub-blocks (i.e., at least two different intra-sub-block pitches P in array 12, and not shown).

Figure 4:
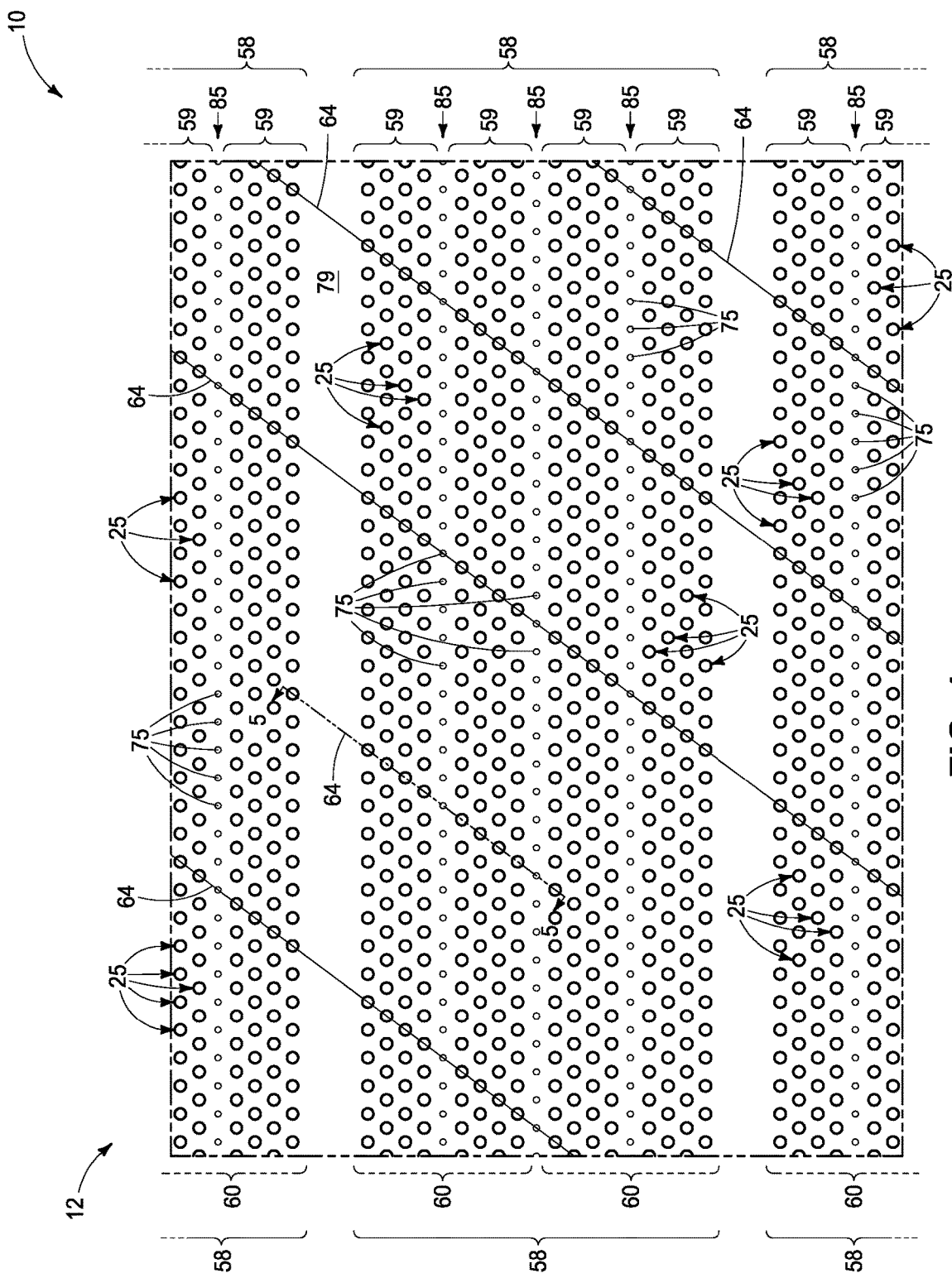
Figure 5:
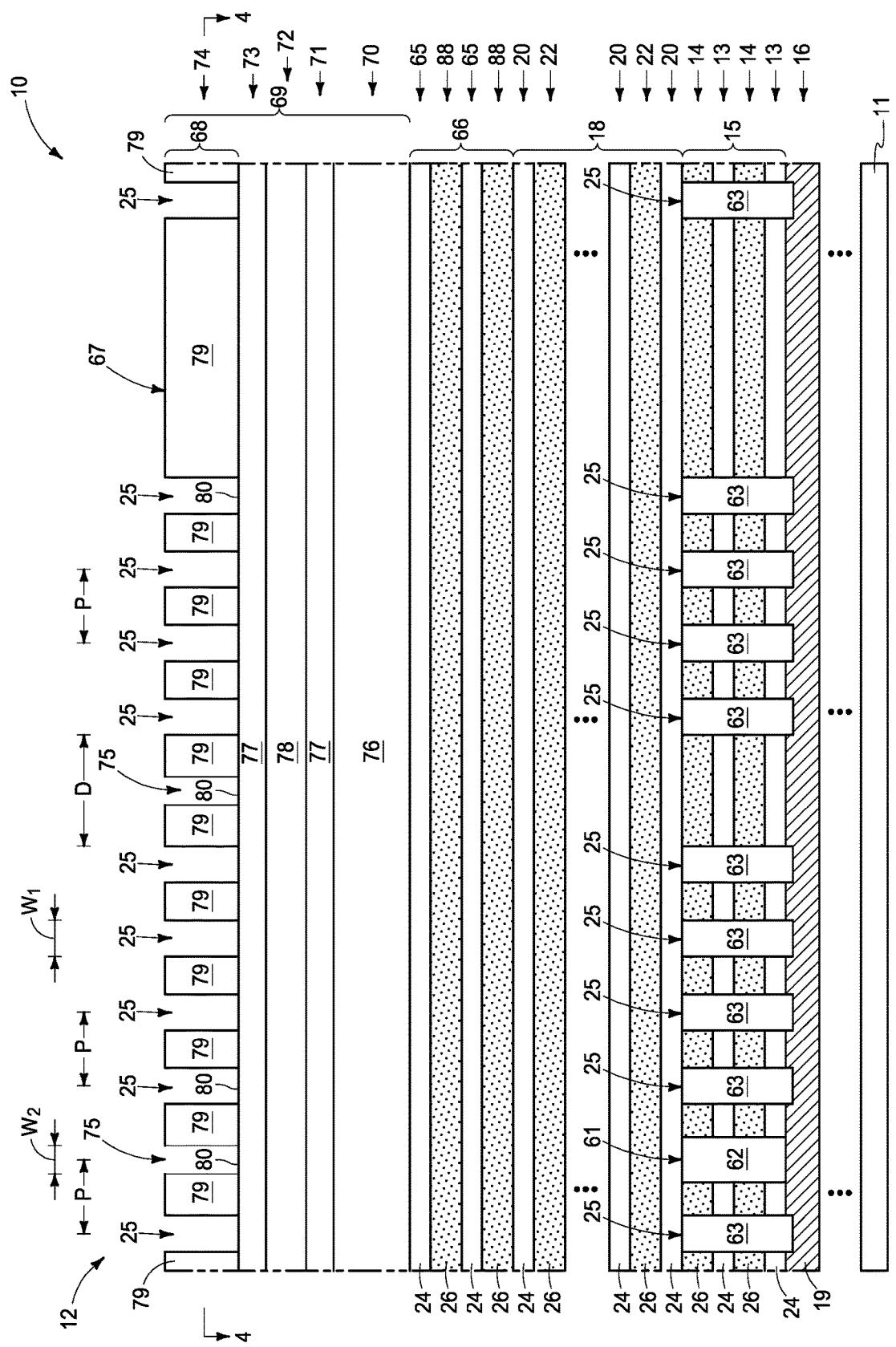

Referring to FIGS. 4 and 5, a stack 18 has been formed above first stack 15. Stack 18 comprises vertically-alternating insulative tiers 20 and wordline tiers 22. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductive tier 16 and stack 18. For example, multiple vertically-alternating tiers of conductive material and insulative material of such circuitry may be below a lowest of the wordline tiers 22 and/or above an uppermost of the wordline tiers 22. Regardless, wordline tiers 22 may not comprise conductive material and insulative tiers 20 may not comprise insulative material or be insulative at this point in processing. Example wordline tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial.

In one embodiment, an upper select gate tier is formed above insulative tiers 20 and wordline tiers 22. In one embodiment and as shown, multiple upper select gate tiers 88 are separated by insulator tiers 65 and comprise a vertical stack 66 formed above stack 18. Upper select gate tiers 88 will ultimately comprise upper select gates, and in one embodiment drain select gates (individually commonly referred to as a select gate drain [SGD]). An upper select gate tier may not comprise conductive material at this point in the processing and where multiple upper select gate tiers are present, some may be conductive and some may be insulative at this point in the processing. Further, two or more of multiple upper select gates in stack 66 (not yet shown) may be directly electrically coupled, or otherwise electrically coupled, relative one another in a finished circuitry construction.

An upper material 67 has been formed above stack 18 and above stack 66 (when present). In one embodiment, upper material 67 comprises a vertical masking stack 69 of multiple different composition masking tiers 70, 71, 72, 73, and 74. Such are by way of example shown as comprising material 76 (e.g., sapphire), material 77 (e.g., a deposited antireflective coating [DARC]), carbon 78, and photoresist 79. An array of openings 25, 75 has been formed in an uppermost portion 68 of upper material 67, with openings 25 comprising channel openings formed within sub-blocks 59 and openings 75 comprising dummy openings formed within space that is laterally between neighboring sub-blocks 59 (e.g., intra-memory block 58). In the context of this document, a "dummy opening" is one of (a) or (b), where (a) is an opening that does not translate into (is not formed in) material that is below the upper material, and (b) is an opening if translated into material below the upper material does not contain an operative conductive component of integrated circuitry in the finished construction or does not remain in the finished construction. In one embodiment and as shown, uppermost portion 68 in which openings 25, 75 are formed is an uppermost of masking tiers 70-74 and in one embodiment array of openings 25, 75 is formed to stop on an uppermost surface 80 of the immediately-lower masking tier that is below the uppermost masking tier (e.g., tier 73). In one embodiment and as shown, dummy openings 75 have smaller maximum horizontal-open dimensions $W_2$ than maximum horizontal-open dimensions $W_1$ of channel openings 25. In one embodiment and as shown, channel openings 25 and dummy openings 75 are formed to collectively have a common horizontal pitch (e.g., P) along parallel horizontally-straight lines between longitudinal edges of blocks 58, such as lines 64. Formation of dummy openings 75 "on-pitch" P with channel openings 25 may facilitate more uniform patterning of channel openings 25 within the sub-blocks, where desired, than would otherwise occur in the absence of presence of dummy openings on-pitch P and particularly where P is the same intra-memory block 58/inter-sub-block 59. In one embodiment, dummy openings 75 may be considered as being in one or more rows 85 between immediately-adjacent sub-blocks 59 (e.g., intra-memory block 58), and in one such embodiment as shown, with one and only one row 85 of dummy openings 75 being between immediately-adjacent sub-blocks 59. Alternately, multiple rows of dummy openings 75 may be between immediately-adjacent sub-blocks (not shown).

Figure 6:
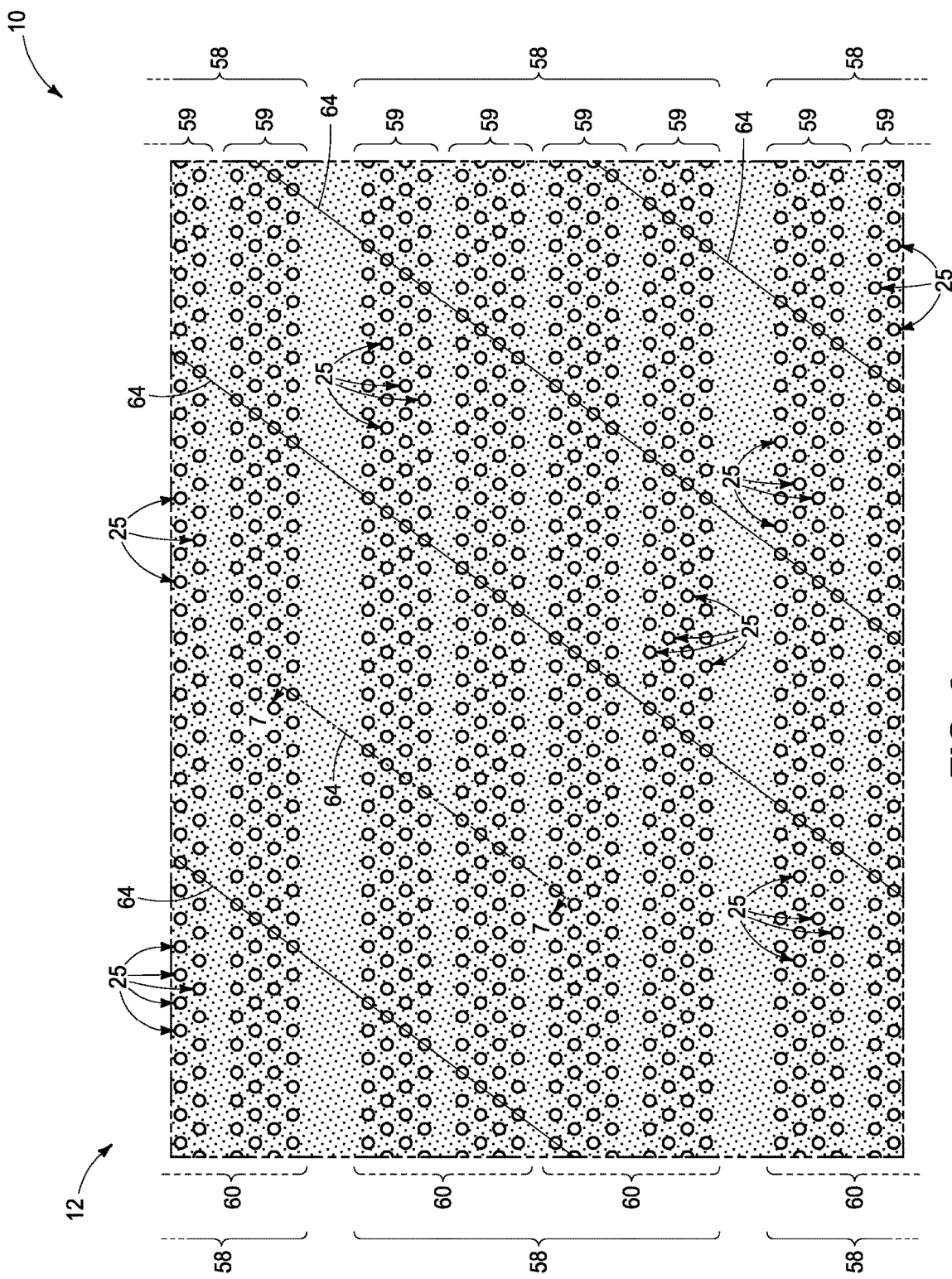
Figure 7:
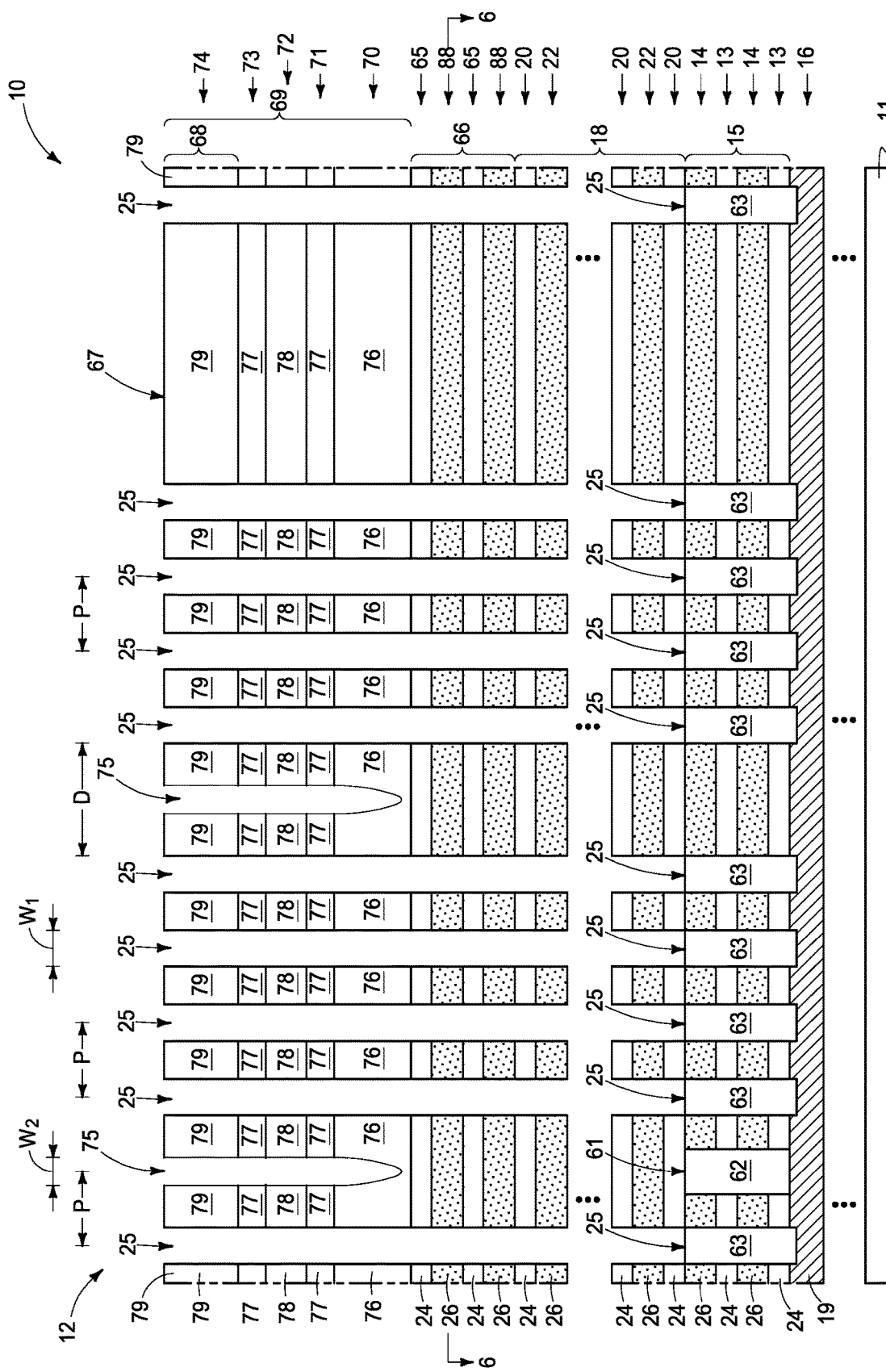
Figure 8:
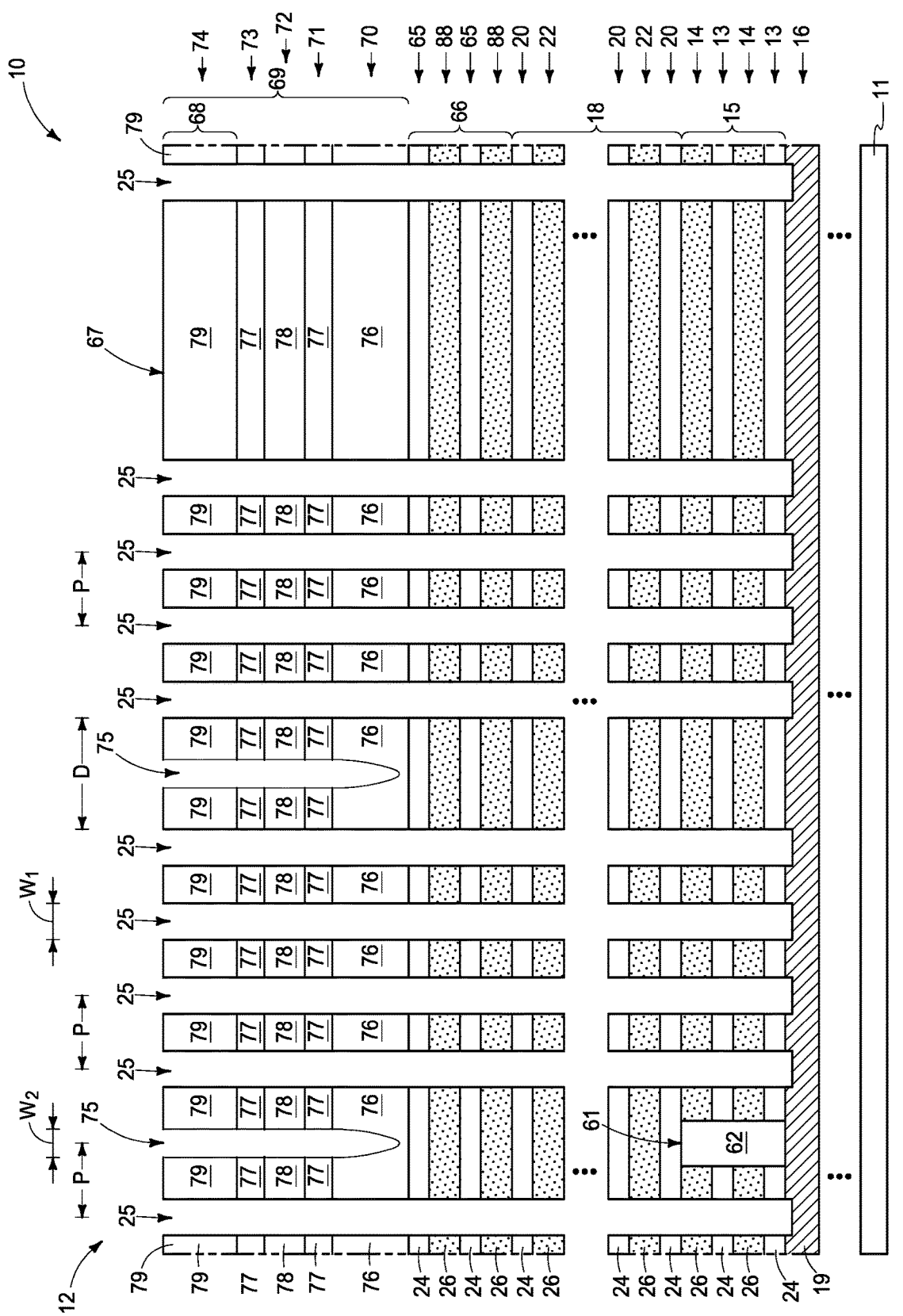

Referring to FIGS. 6 and 7, at least uppermost portion 68 of upper material 67 has been used as a mask while etching channel openings 25 and dummy openings 75 into a lower portion (e.g., some or all of tiers 73, 72, 71, 70 when present) of upper material 67, with channel openings 25 being etched into insulative and wordline tiers 20, 22, respectively, and with channel openings 25 being etched deeper into construction 10 than as dummy openings 75. Ideally, such etching of channel openings and dummy openings is conducted simultaneously. In one embodiment, dummy openings 75 are not formed into any select gate tier 88 (as shown) and in another embodiment are formed into a select gate tier 88 (not shown). In one embodiment, dummy openings 75 are not formed into insulative tiers 20 and wordline tiers 22 (as shown), and in an alternate embodiment are formed into insulative tiers 20 and wordline tiers 22 (not shown). Dummy openings may inherently be precluded from extending through stack 69 if $W_2$ is sufficiently small. In one embodiment and as shown, the etching of channel openings 25 through insulative tiers 20 and wordline tiers 22 has been conducted to stop on (i.e., atop or within) etch-stop material (e.g., 63) that is in or below insulative and wordline tiers 20, 22, respectively. In one such embodiment and as shown in FIG. 8, etch-stop material 63 (not shown) has been subsequently removed to effectively lengthen channel openings 25 to conductive tier 16. In an alternate embodiment (not shown) where an etch-material is used, such may be formed in openings (not shown) in conductive tier 16.

Transistor channel material is ultimately formed in the individual channel openings and is directly electrically coupled with conductive material in the conductive tier. Individual memory cells of the array may be formed to comprise a gate region (e.g., a control-gate region) and a memory structure laterally between the gate region and the channel material. In one such embodiment, the memory structure is formed to comprise a charge-blocking region, storage material (e.g., charge-storage material), and insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a bandgap-engineered structure having nitrogen containing material [e.g., silicon nitride] sandwiched between two insulator oxides [e.g., silicon dioxide]) is laterally between the channel material and the storage material.

Figure 9:
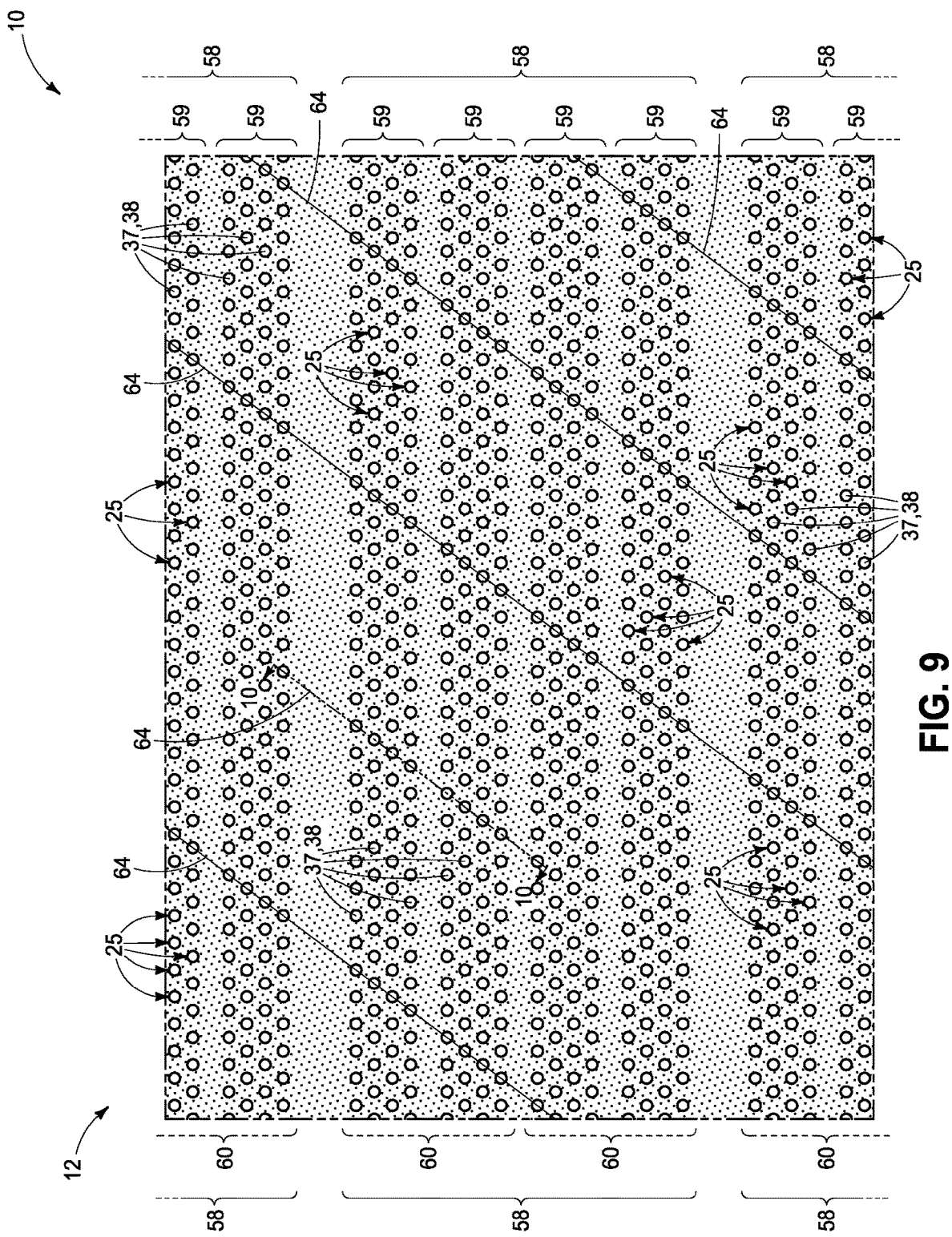
Figure 10:
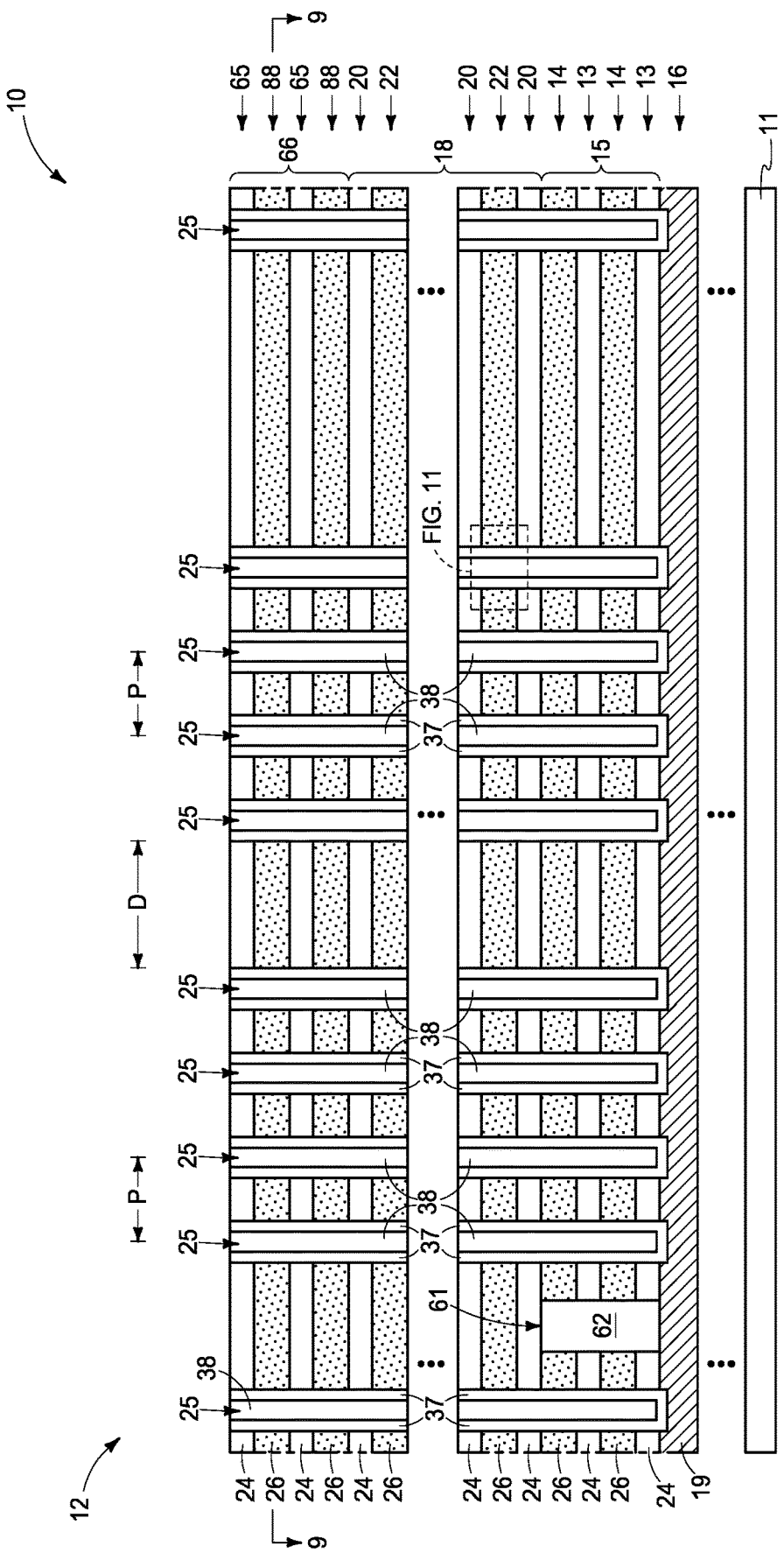
Figure 11:
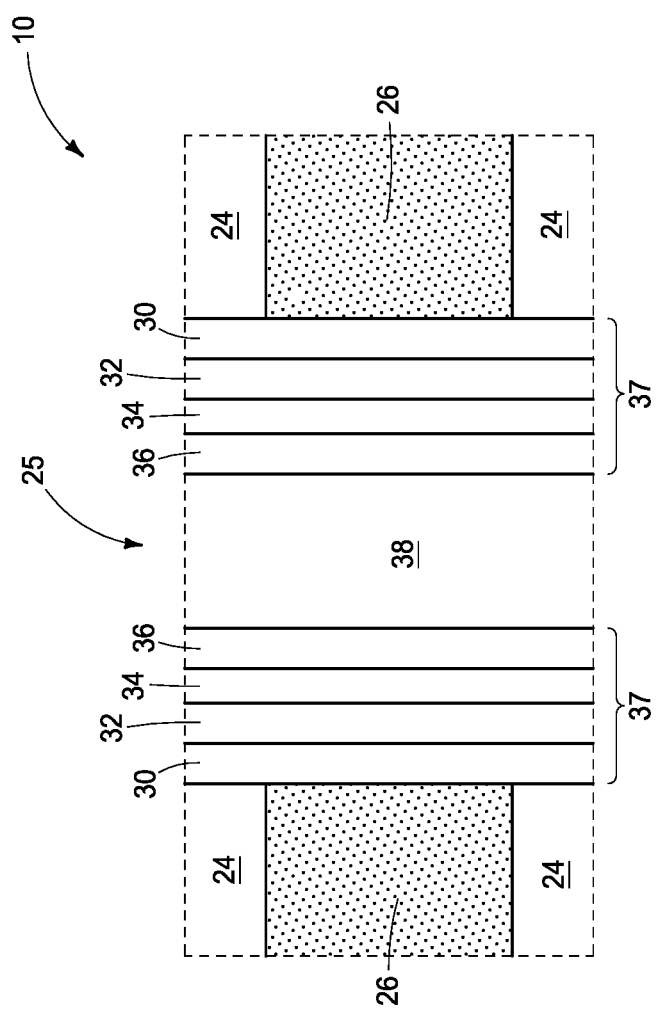

Referring to FIGS. 9-11, and in one embodiment, all of upper material 67 (not shown) has been removed (as shown) after the processing of FIG. 8. FIG. 11 shows one embodiment wherein charge-blocking material 30, storage material 32, and charge-passage material 34 have been formed in individual channel openings 25 elevationally along insulative tiers 20, wordline tiers 22, and select gate tiers 14 and 88. Transistor materials 30, 32 and 34 (e.g., memory cell materials) may be formed by, for example, deposition of respective thin layers thereof over stack 15/18/66 and within individual channel openings 25 followed by planarizing such back at least to an uppermost surface of stack 18. Channel material 36 has been formed in channel openings 25 elevationally along the depicted tiers. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 to expose conductive tier 16 such that channel material 36 is directly against conductive material 19 of conductive tier 16 (not shown). Alternately, and by way of example only, no punch etching may be conducted and channel material 36 may be directly electrically coupled to material 19 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown). Collectively, materials 30, 32, 34, and 36 are designated as material 37 primarily for clarity in FIGS. 9 and 10.

Figure 12:
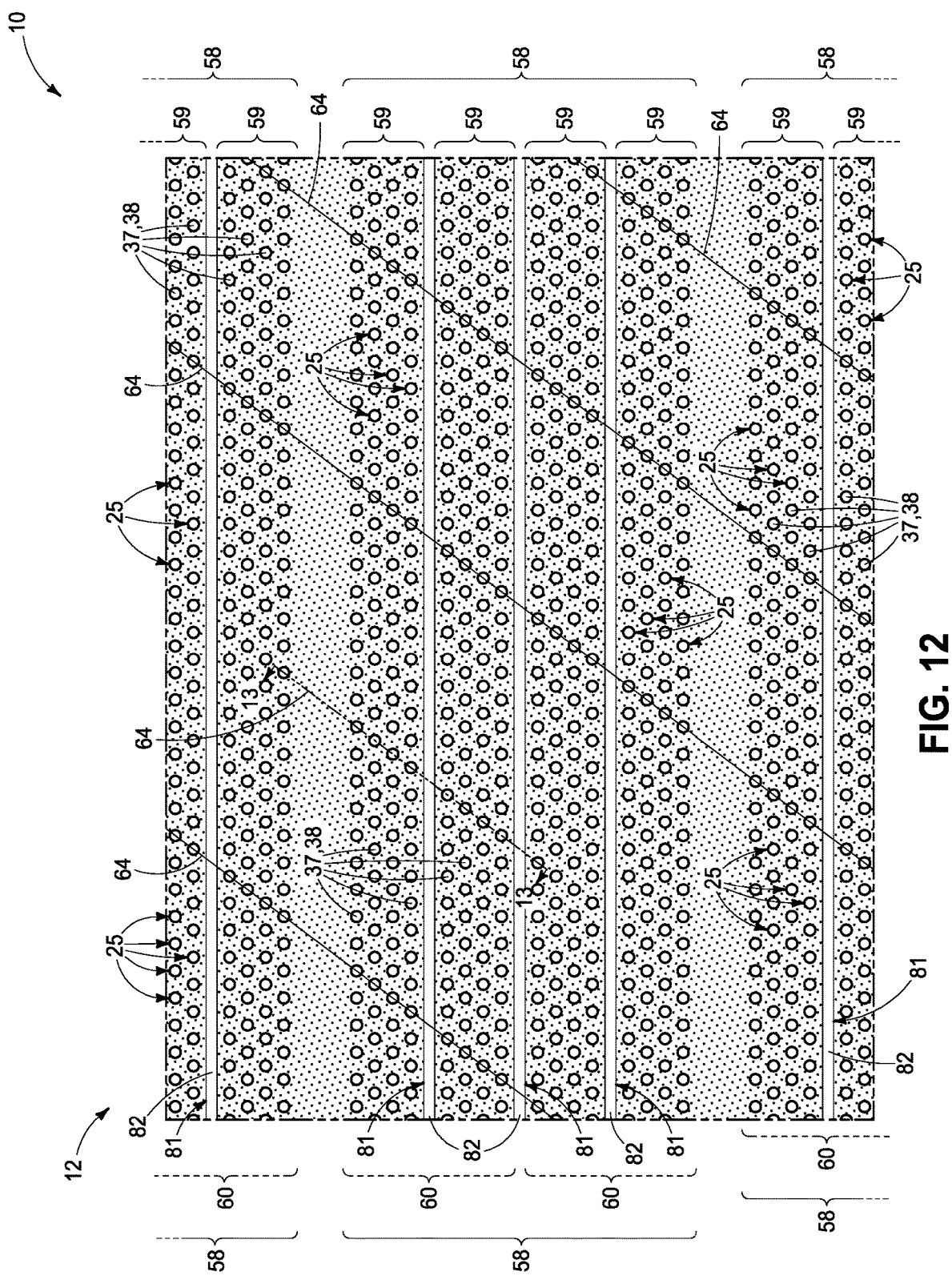
Figure 13:
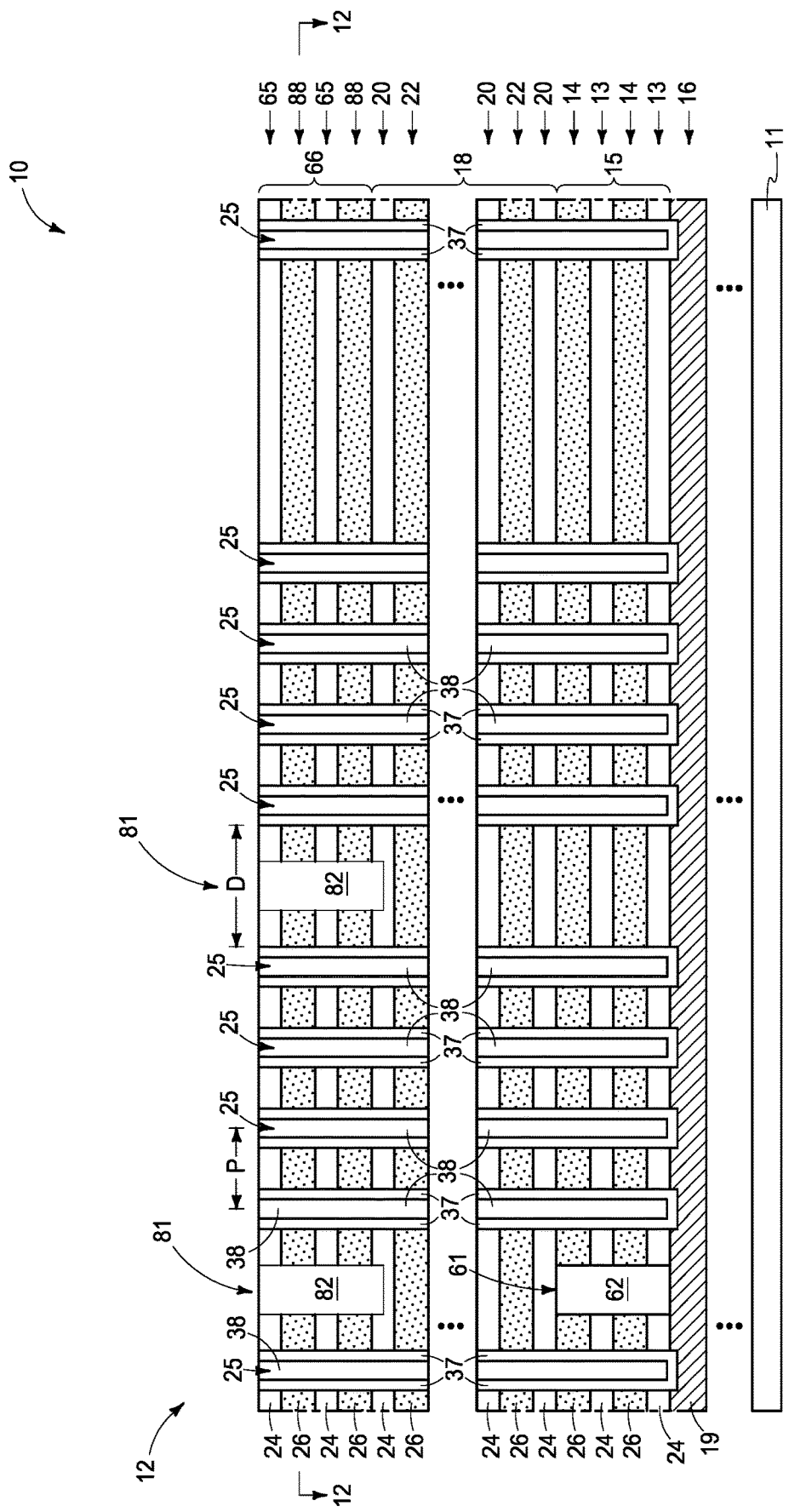

Referring to FIGS. 12 and 13, isolation structures 81 have been formed in an uppermost portion of construction 10 laterally between sub-blocks 59 (e.g., intra-memory block 58), and by way of example are shown as comprising insulator material 82 (e.g., silicon dioxide, aluminum dioxide, hafnium oxide, etc.). Although isolation structures 81 are described in the example method as being formed after forming material 37, 38 within channel openings 25, isolation structures 81 when formed may be formed before forming materials 37, 38 including before forming channel openings 25. Further, isolation structures 81 may be formed after conducting material has been formed within any one or more tiers 14, 22, and/or 88 regardless of when such conducting material is formed.

Figure 14:
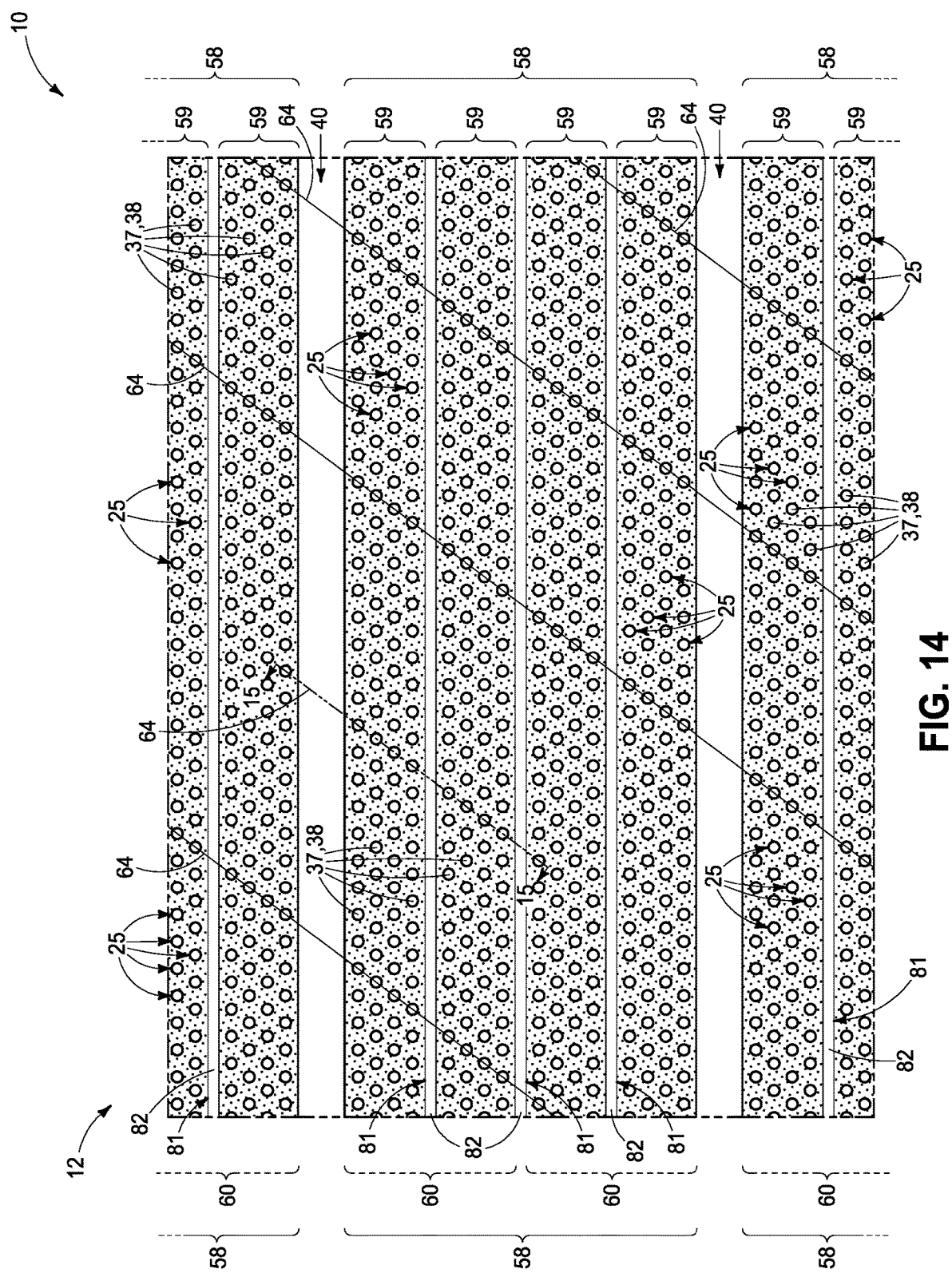
Figure 15:
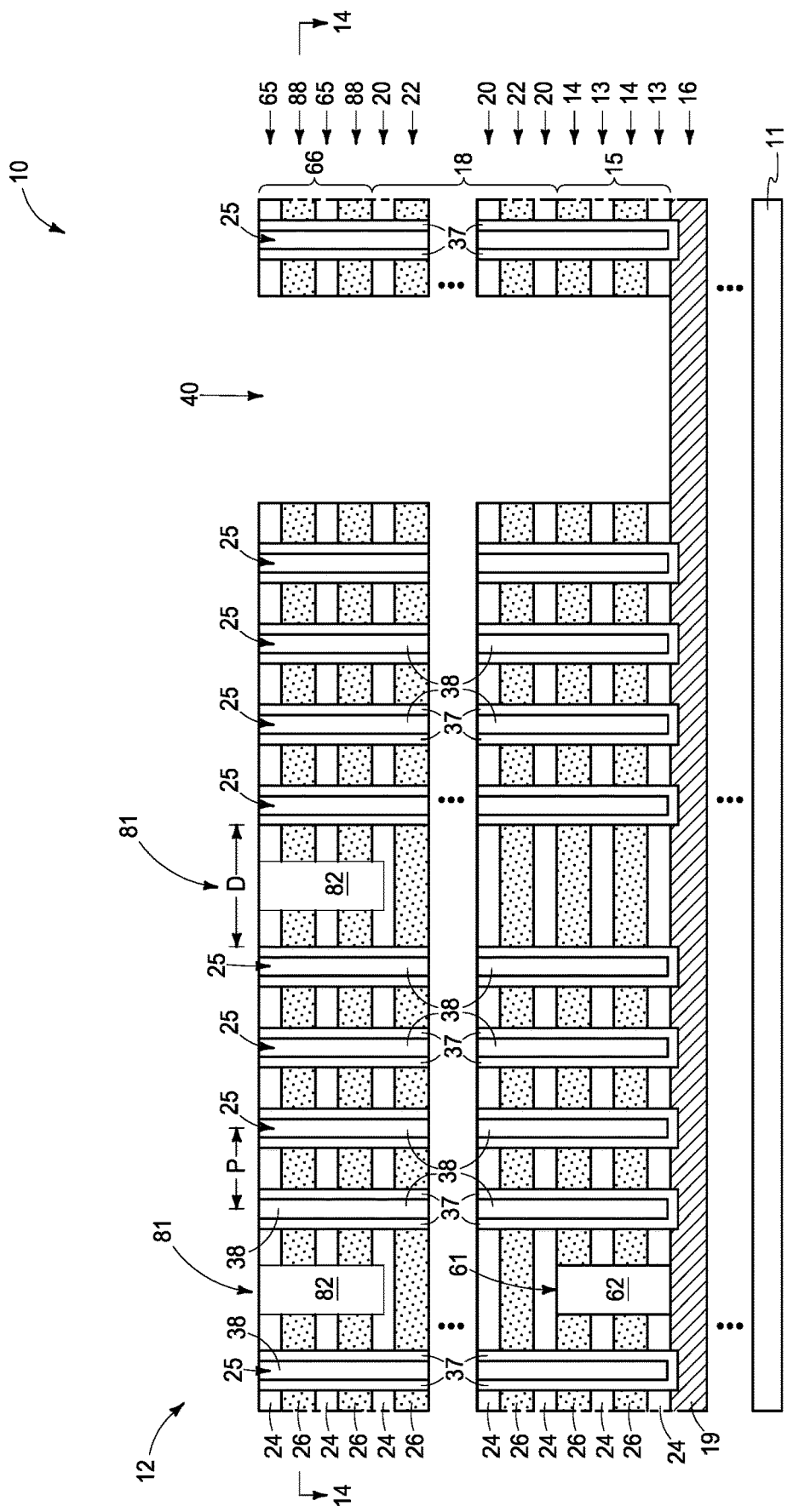

Referring to FIGS. 14 and 15, horizontally-elongated trenches 40 have been formed (e.g., by anisotropic etching)

through stack 15/18/66 to conductive tier 16. Horizontally-elongated trenches 40 may have respective bottoms that are directly against conductive material 19 of conductive tier 16 (e.g., atop or within material 19). Alternately, horizontally-elongated trenches 40 may have respective bottoms that are above conductive material 19 of conductive tier 16 (not shown).

Figure 16:
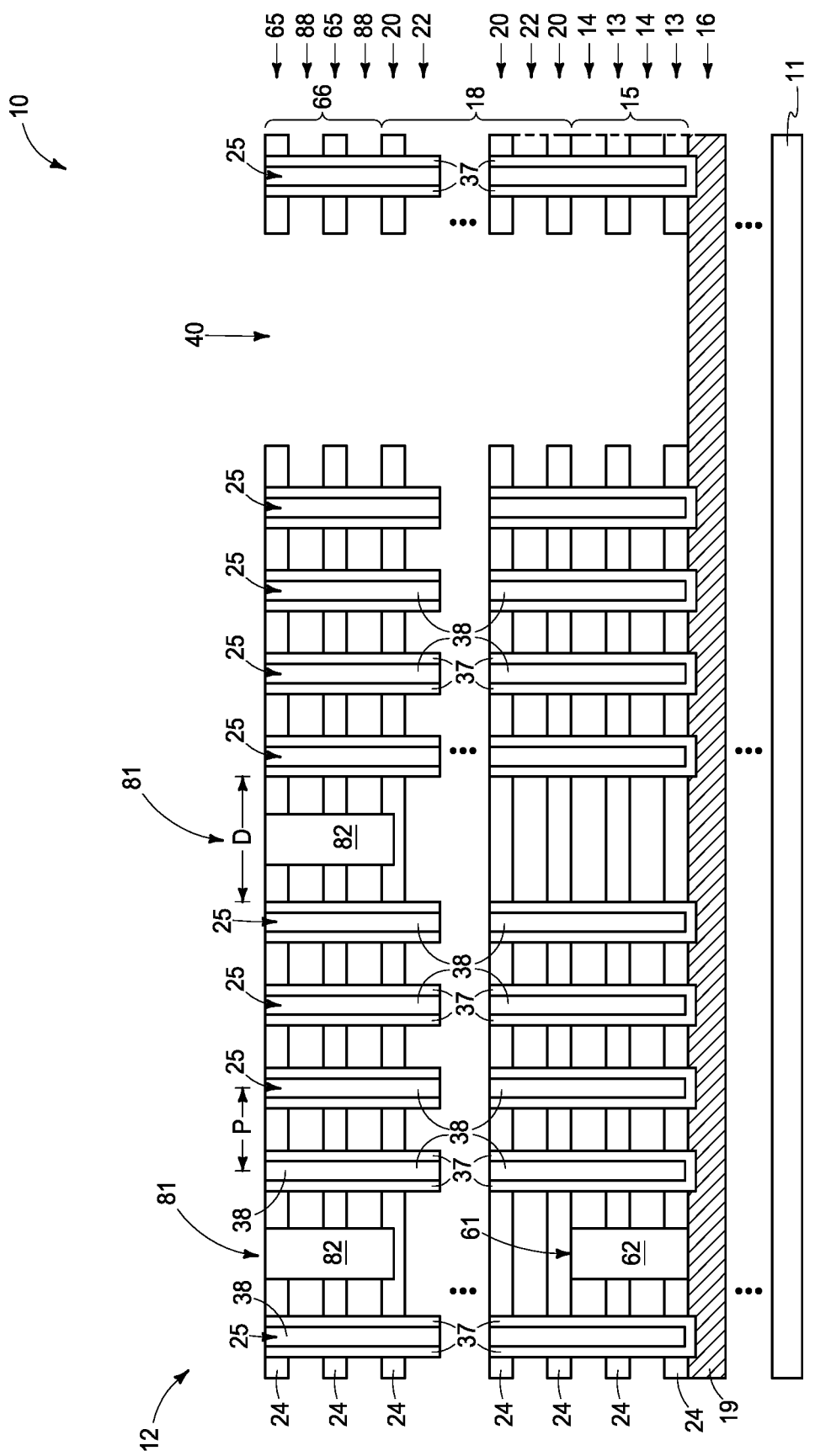

Referring to FIG. 16, material 26 (not shown) of wordline tiers 22 and select gate tiers 14 and 88 has been etched selectively relative to materials 24, 82, 37, 38, and 62 (e.g., using liquid or vapor H$_3$PO$_4$ as a primary etchant where material 26 is silicon nitride and materials 24, 82, 37, 38, and 62 are polysilicon or other oxides.

Figure 17:
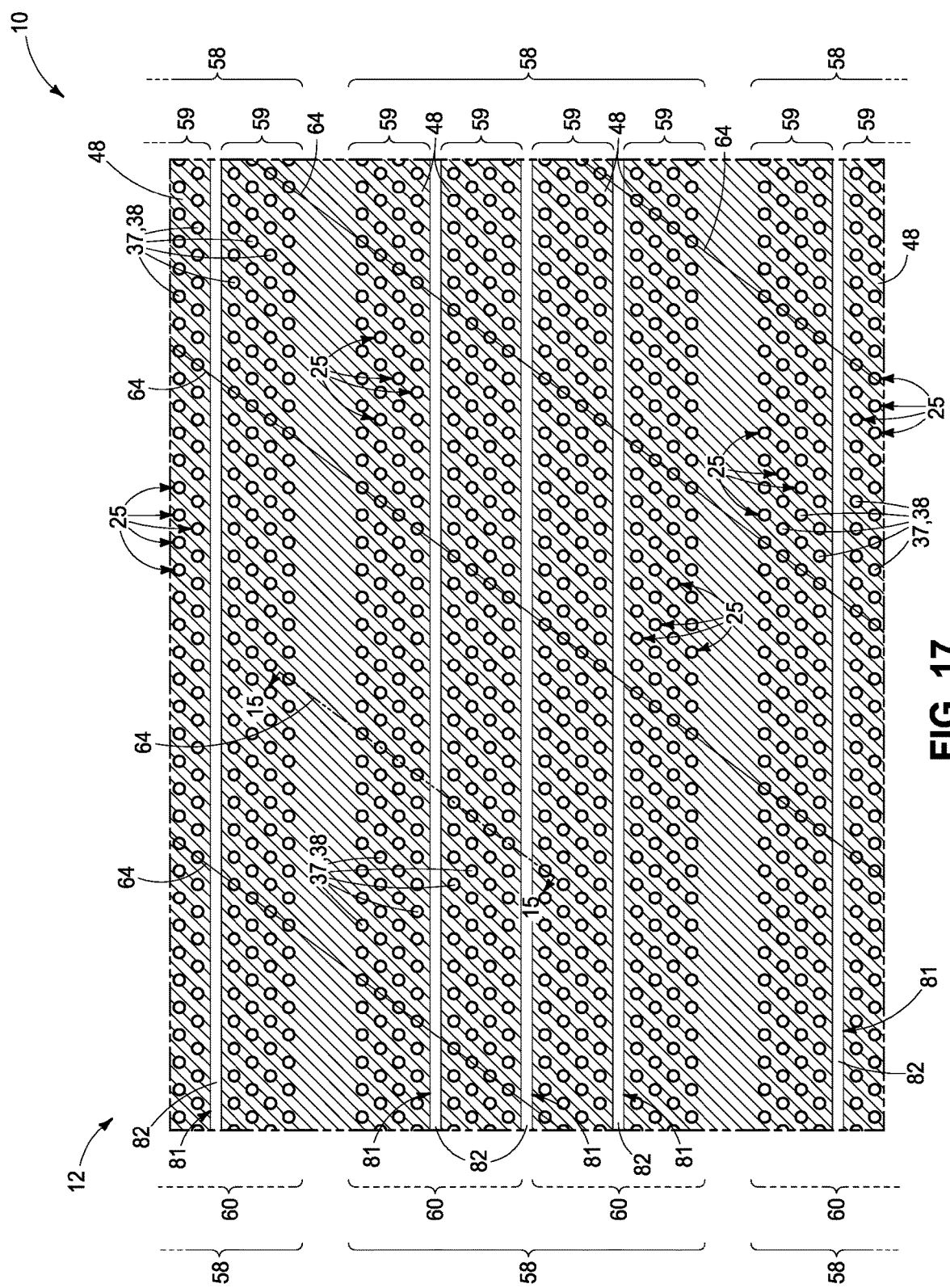
Figure 18:
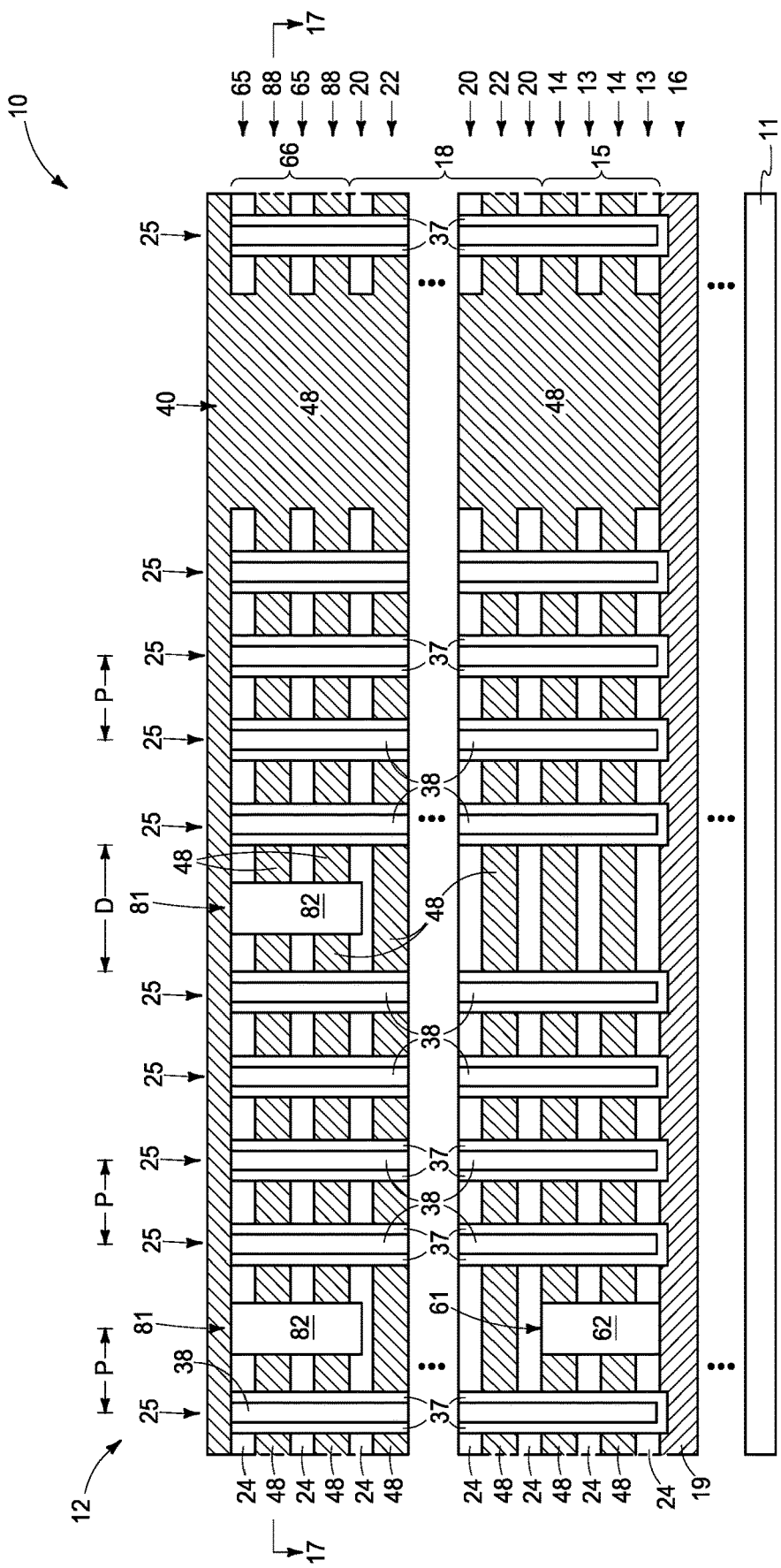
Figure 19:
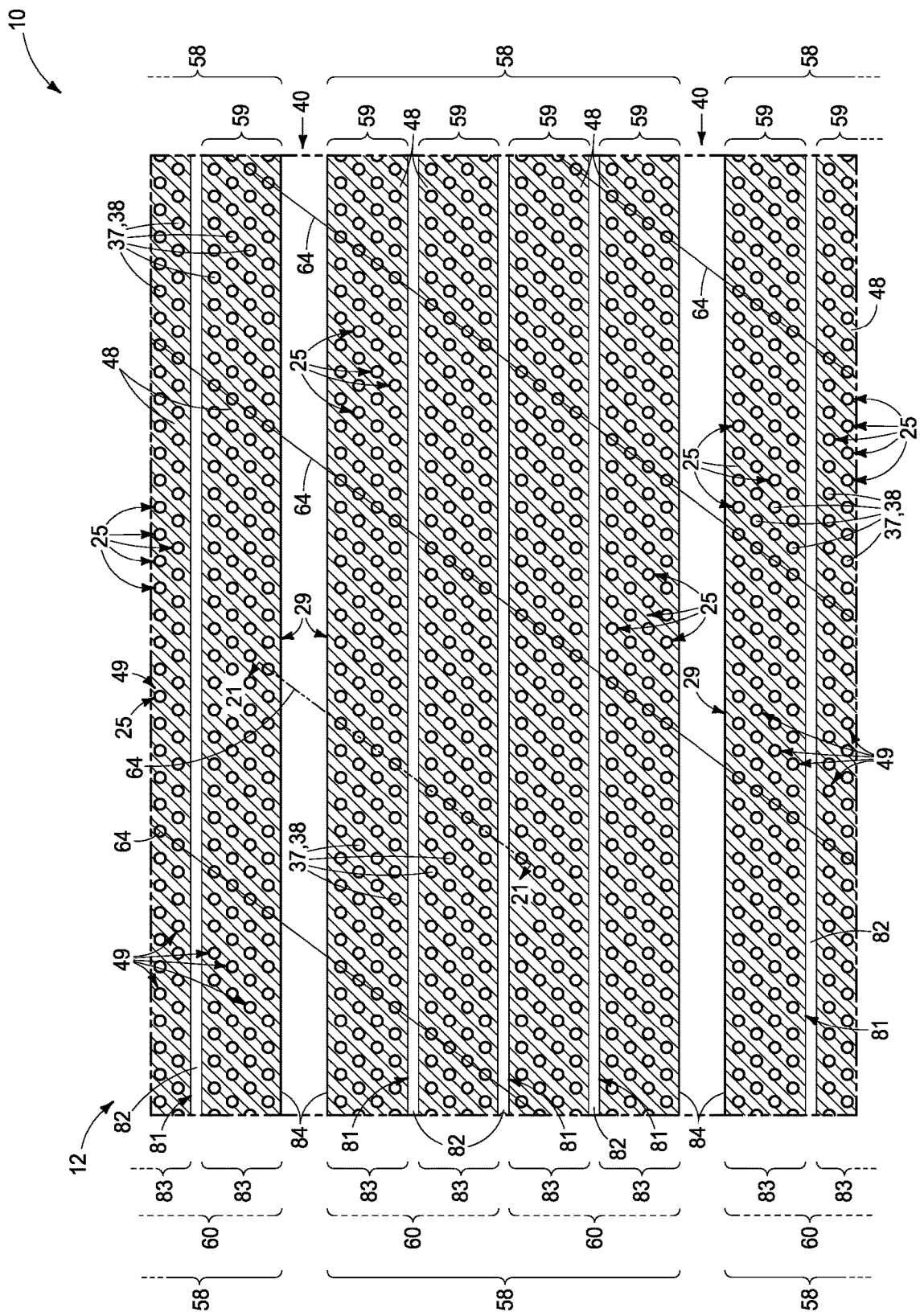
Figure 20:
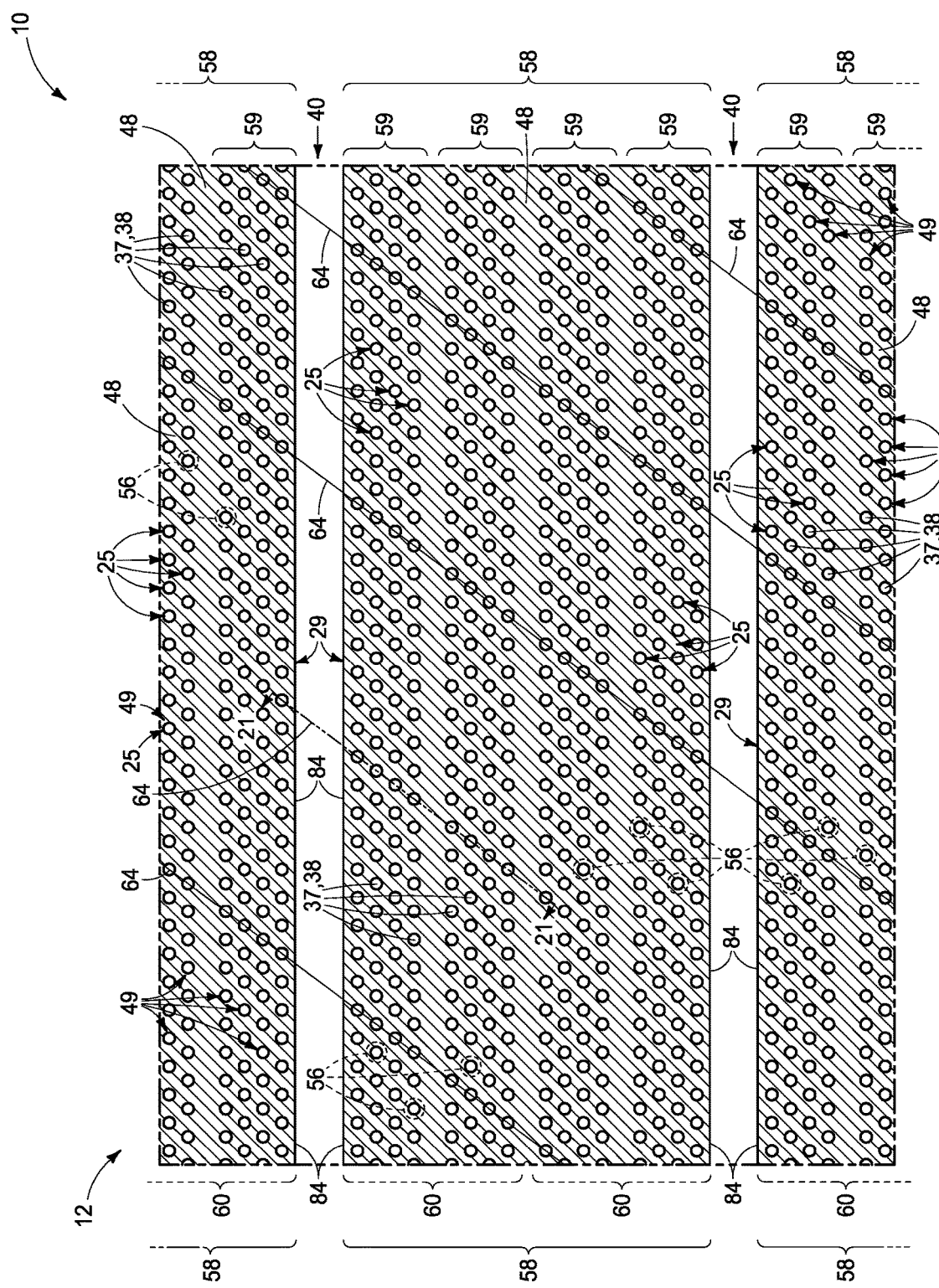
Figure 21:
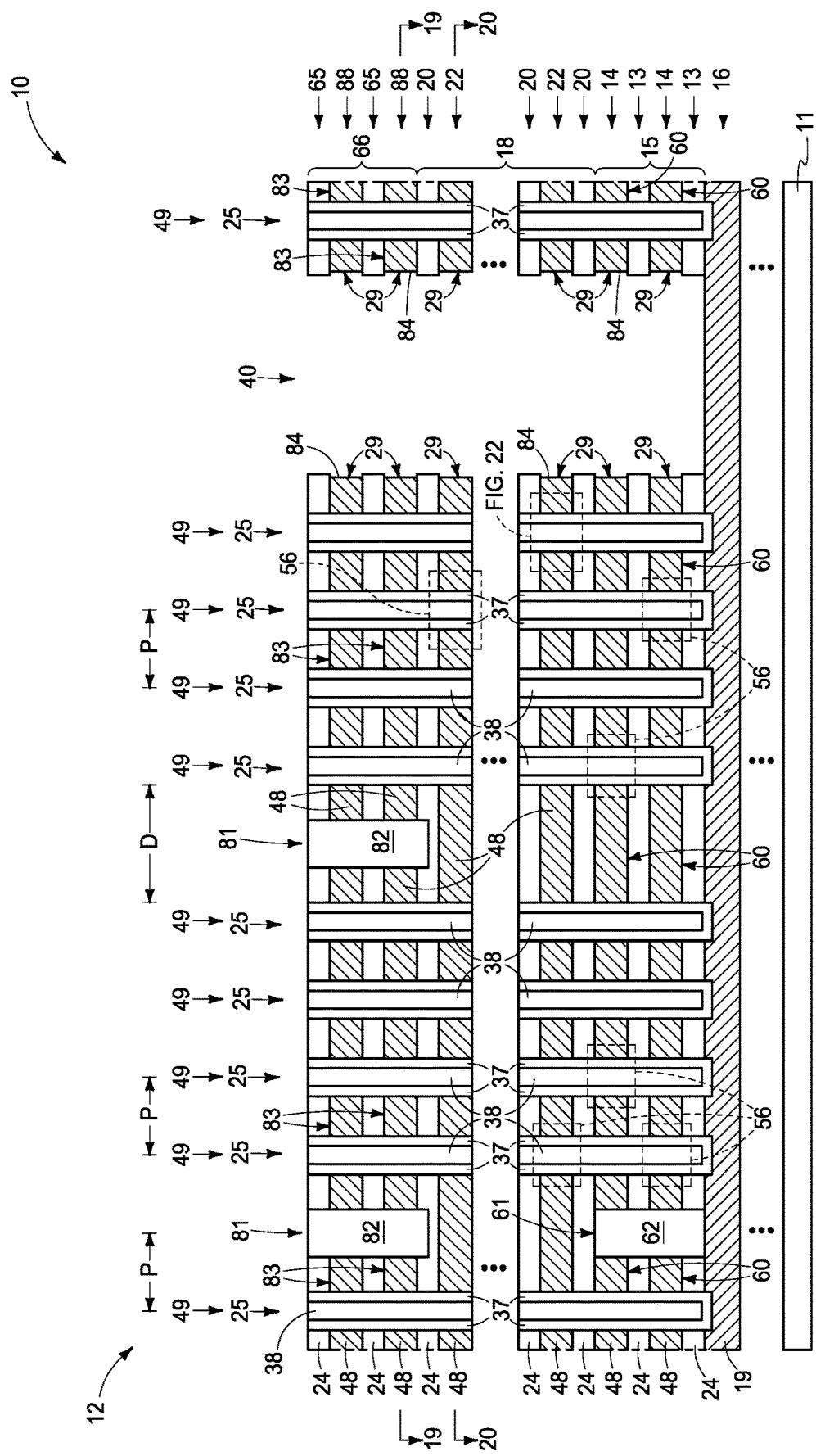
Figure 22:
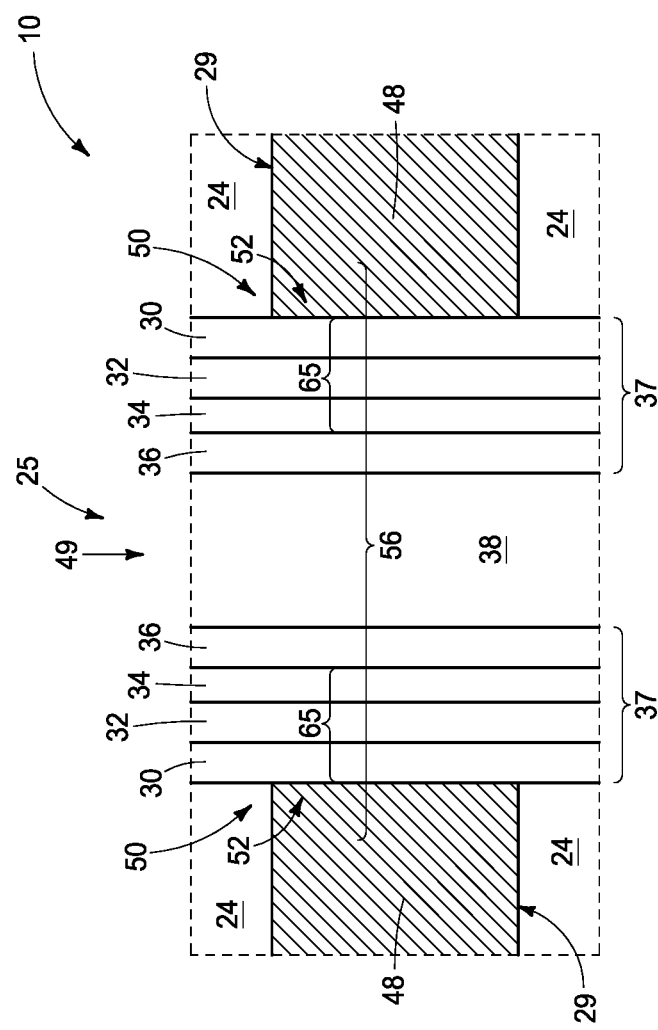

Conducting material is ultimately formed into wordline tiers 22 and into select gate tiers 14 and 88, and which will comprise conducting material of the individual wordlines and select gates to be formed. Referring to FIGS. 17 and 18, such show an example embodiment wherein conducting material 48 has been formed into wordline tiers 22 and into select gate tiers 14 and 88 through trenches 40. Any suitable conducting material 48 may be used, for example one or both of metal material and/or conductively-doped semiconductor material. In but one example embodiment, conducting material 48 comprises a first-deposited conformal titanium nitride liner (not shown) followed by deposition of another composition metal material (e.g., elemental tungsten). A thin insulating material lining (e.g., at least one of Al$_2$O$_3$ and HfO$_x$ and not shown) may be formed into wordline tiers 22 and into select gate tiers 14 and 88 through trenches 40 prior to forming conducting material 48.

Referring to FIGS. 19-22, conducting material 48 has been removed from individual trenches 40. Such has resulted in formation of wordlines 29 and elevationally-extending strings 49 of individual transistors and/or memory cells 56. Approximate locations of transistors and/or memory cells 56 are indicated with a bracket in FIG. 22 and some with dashed outlines in FIGS. 19-21, with transistors and/or memory cells 56 being essentially ring-like or annular in the depicted example. Conducting material 48 may be considered as having terminal ends 50 (FIG. 22) corresponding to control-gate regions 52 of individual transistors and/or memory cells 56. Control-gate regions 52 in the depicted embodiment comprise individual portions of individual wordlines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition insulative storage material between an insulative storage material 32 and conducting material 48). Regardless, as an additional example, an interface of a storage material and conductive material of a control gate may be sufficient to function as a charge-blocking region in the absence of any separate-composition insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Memory blocks 58 may be considered as comprising longitudinal edges 84. Upper portions of sub-blocks 59 are laterally spaced by laterally-spaced upper select gates 83 (FIGS. 19 and 21) (e.g., SGD's) of individual memory blocks 58 (e.g., upper select gates 83 being laterally spaced by isolation structures 81). In one embodiment and as shown, sub-blocks 59 individually include one and only one upper select gate 83 in a finished circuitry construction. In one embodiment and as shown, there are twice as many upper select gates 83 as lower select gates 60 in individual memory blocks 58 in the finished circuitry construction. Regardless, two or more upper select gates 83 in an individual memory block 58 may be directly electrically coupled together (not shown) or otherwise electrically coupled together (not shown).

Figure 23:
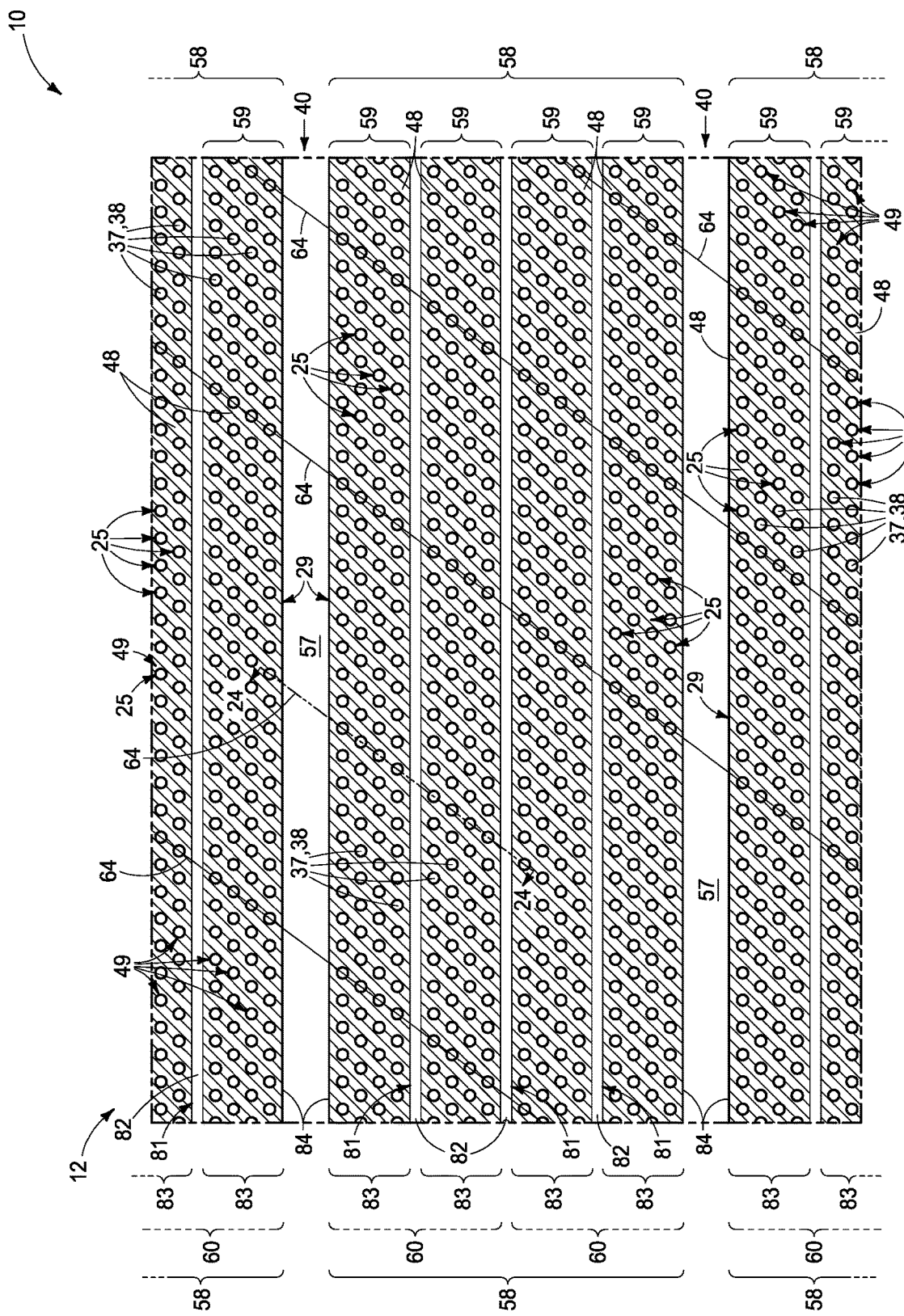
Figure 24:
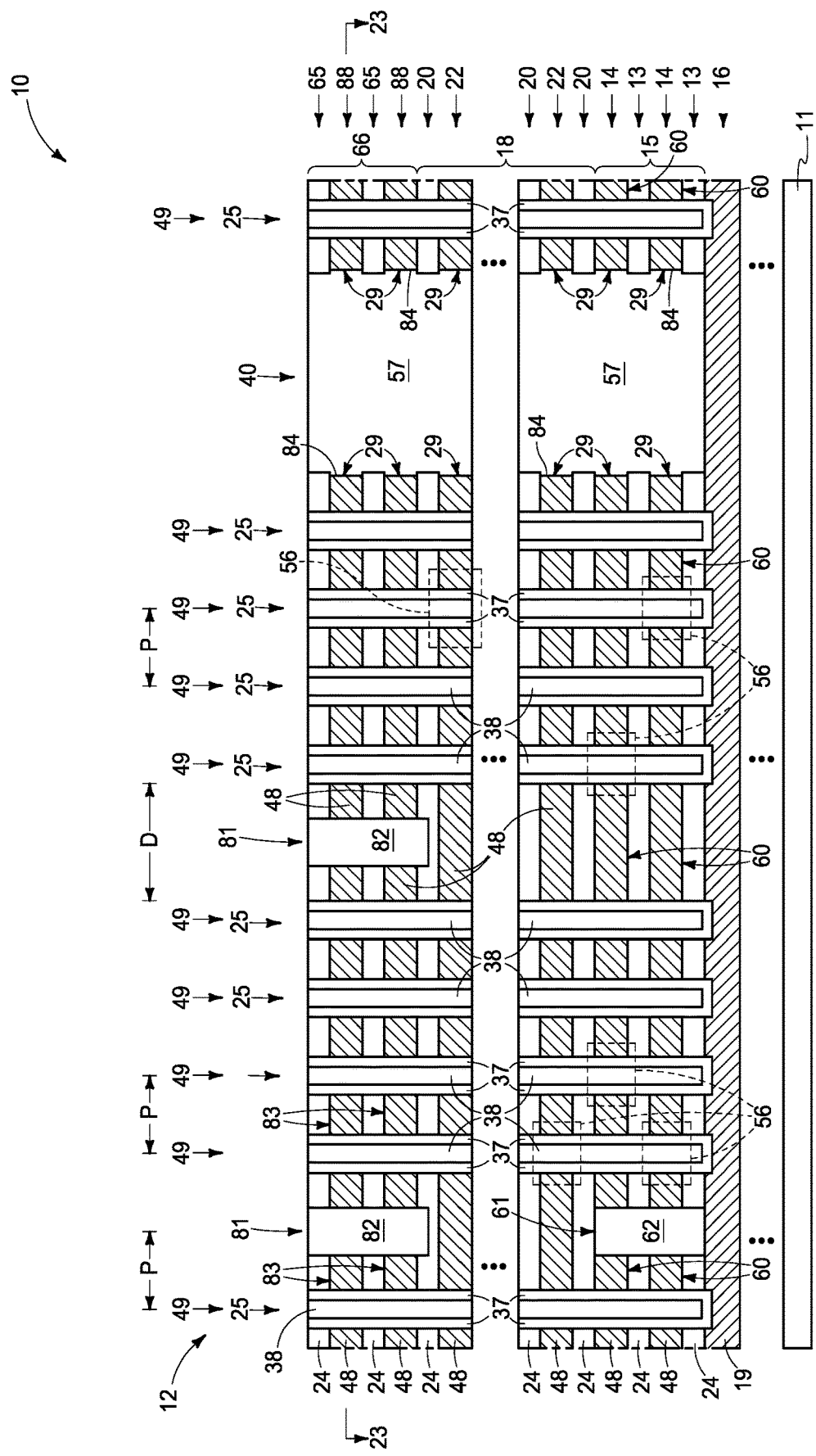

Referring to FIGS. 23 and 24, a material 57 (dielectric and/or silicon-containing such as undoped polysilicon) has been formed in individual trenches 40.

In one embodiment, the memory array comprises NAND and in one embodiment CMOS under array circuitry.

Any other attribute(s) or aspect(s) as shown and/or described herein with respect to other embodiments may be used with respect to the above-described embodiments.

The above example processing shows forming conducting material 48 of individual wordlines 29 in wordline tiers 22 after forming channel material 36. Alternately, and by way of example only, the conducting material of the individual wordlines in the wordline tiers may be formed before forming channel material 36, including even before forming channel openings 25.

Embodiments of the invention encompass memory arrays independent of method of manufacture. Nevertheless, such memory arrays may have any of the attributes as described herein in method embodiments. Likewise, the above-described method embodiments may incorporate and form any of the attributes described with respect to device embodiments.

In one embodiment, a memory array (e.g., 12) comprises strings (e.g., 49) of memory cells (e.g., 56) comprising laterally-spaced memory blocks (e.g., 58). The memory blocks individually comprise sub-blocks (e.g., 59) defined at least in part by laterally-spaced upper select gates (e.g., 83) of individual memory blocks. A vertical stack (e.g., 18) is below the upper select gates and has alternating insulative tiers (e.g., 20) and wordline tiers (e.g., 22). Operative channel-material strings (e.g., that also may be considered as designated by numerals 49) extend elevationally through the upper select gates and through the insulative tiers and the wordline tiers within the sub-blocks. The channel-material strings have a common horizontal pitch (e.g., P) within the individual sub-blocks (e.g., at least intra-sub-block) along parallel horizontally-spaced straight lines (e.g., 64) between longitudinal edges (e.g., 84) of the individual memory blocks. The channel-material strings along the parallel horizontally-spaced straight lines are horizontally spaced from one another between the sub-blocks by a distance (e.g., D) that is greater than the common horizontal pitch.

In one embodiment, the wordline tiers comprise gate regions (e.g., 52) of individual of the memory cells, with the gate regions individually comprising part of a wordline (e.g., 29) in individual of the wordline tiers. The individual memory blocks are characterized by conducting material (e.g., 48) of the wordline in the individual wordline tiers that extends horizontally continuously from and between the longitudinal edges (e.g., 84) of the individual memory blocks. For example, in FIG. 20, a continuous straight line, a continuous curved line, a continuous line having multiple straight sections angled relative one another, a continuous line having a combination of straight and curved segments, etc., can be drawn between longitudinal edges 84 in individual memory blocks 58 (i.e., intra-memory block). Alternately and/or additionally considered, conducting material 48 in FIG. 20 between sub-blocks 59 may be considered as conductive rails. In one embodiment, the memory array is devoid of any electrical isolation structure extending vertically through the insulative tiers and the wordline tiers within and all along the individual memory blocks (i.e., there is no dielectric, semiconductive, or conductive electrical isolation structure, for example no electrical isolation structure as shown as structure 530 in U.S. Pat. No. 8,797,806).

Figure 25:
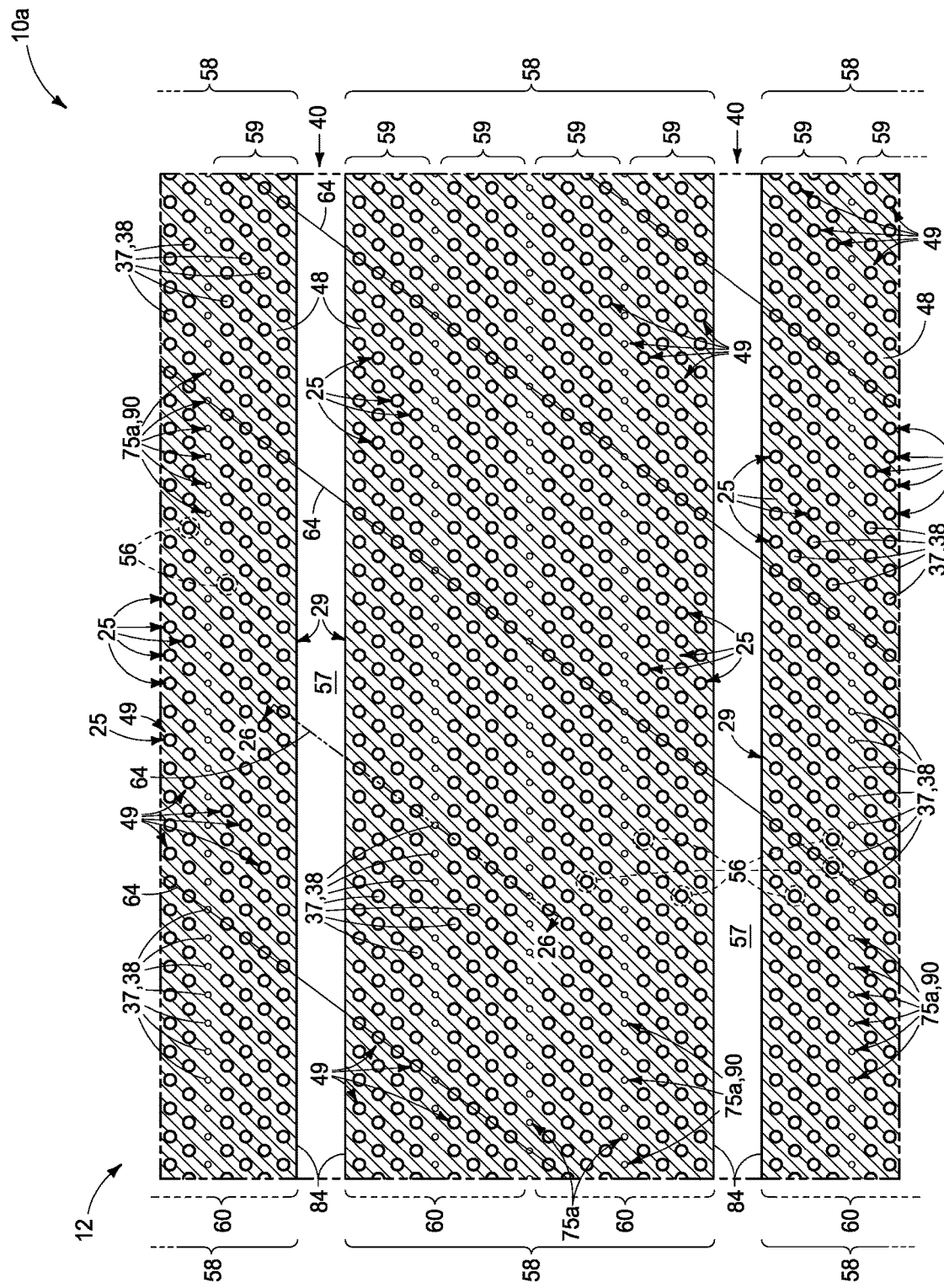
FIGS. 25 and 26 are diagrammatic cross-sectional views of a portion of a substrate in accordance with an embodiment of the invention.
Figure 26:
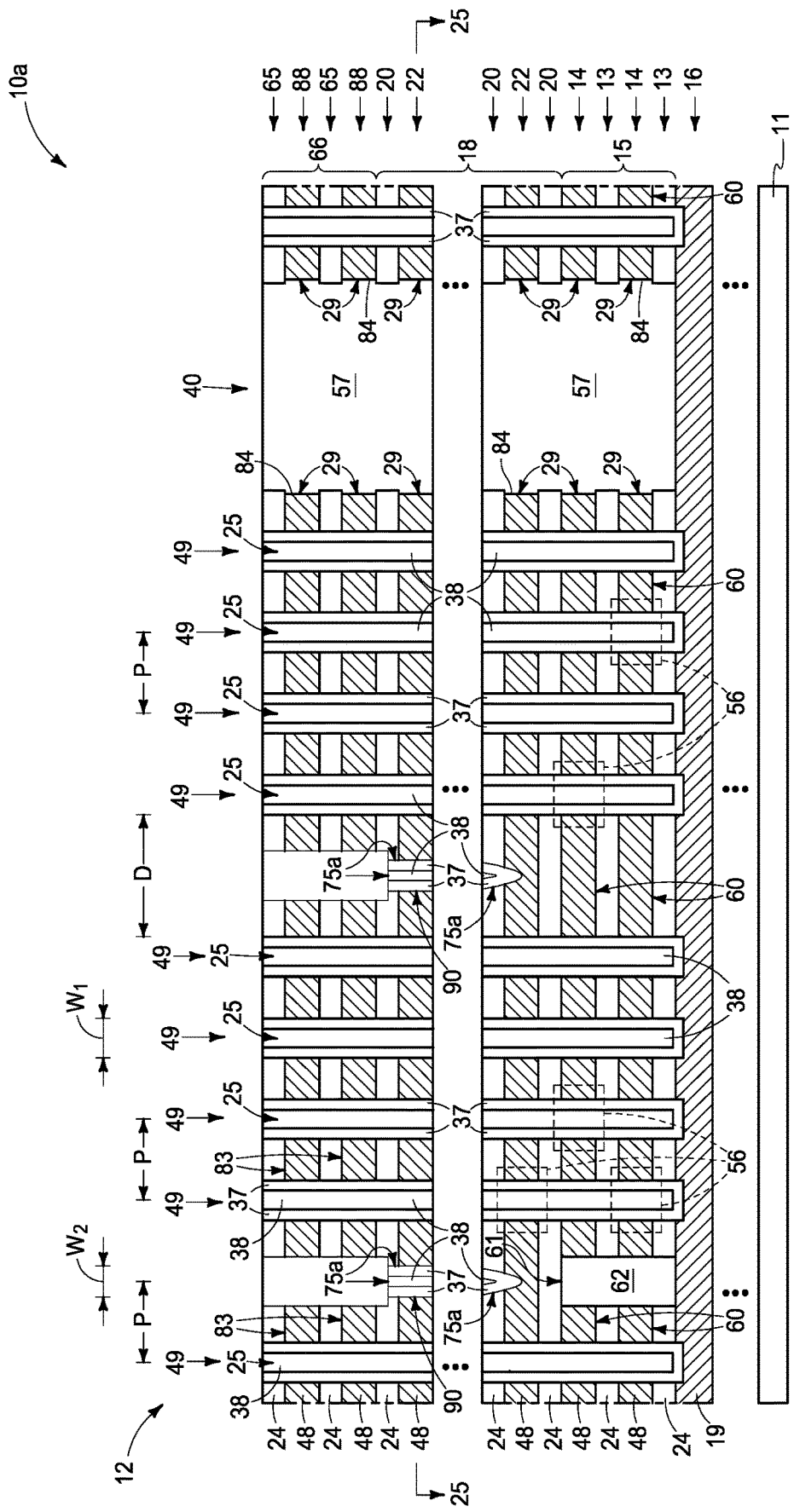

In one embodiment, the array comprises elevationally-extending dummy channel-material strings in the insulative tiers and the wordline tiers between the sub-blocks. In this document, a "dummy channel-material string" is a string containing channel material in a finished circuitry construction that is circuit-inoperative, meaning no current flow there-through and which may be a circuit-inoperable dead-end that is not part of a current flow path of a circuit even if extending to or from an electronic component. An example such method embodiment and structure embodiment are next described with reference to FIGS. 25 and 26 with respect to a construction 10a. Like numerals from the above-described embodiments have been used where appropriate, with some construction differences being indicated with the suffix "a" or with different numerals. FIGS. 25 and 26 show an example embodiment wherein dummy openings 75a have been formed into insulative tiers 20 and wordline tiers 22 resulting in dummy channel-material strings 90. Such are not shown as having been formed in select gate tiers 88 although such may have been formed therein prior to forming isolation structures 81. Further, if isolation structures 81 are formed prior to formation of dummy openings 75a, dummy openings 75a may extend elevationally through isolation structures 81 (not shown) as may dummy channel-material strings 90 (not shown). Regardless, and in one embodiment, channel material 36 (as part of collective material 37) has been formed in dummy openings 75a and as shown remains in the finished-circuitry construction. In one embodiment, no portion of dummy channel-material strings 90 is at the same elevation as any laterally-spaced upper select gate 83. In one embodiment, dummy channel-material strings 90 individually have a maximum horizontal width (e.g., $W_2$) that is smaller than a maximum horizontal width of individual of the operative channel-material strings (e.g., $W_1$ of strings 49). In one embodiment, operative channel-material strings 49 are taller than dummy channel-material strings 90. Any other attribute(s) or aspect(s) as shown and/or described herein with respect to other embodiments may be used.

In one embodiment, the array is devoid of any dummy channel-material strings in the wordline tiers between the sub-blocks (e.g., FIGS. 19-24). Any other attribute(s) or aspect(s) as shown and/or described herein with respect to other embodiments may be used.

In one embodiment, a memory array (e.g., 12) comprising strings (e.g., 49) of memory cells (e.g., 56) comprises laterally-spaced memory blocks (e.g., 58) individually comprising sub-blocks (e.g., 59) defined at least in part by laterally-spaced upper select gates (e.g., 83) of the individual memory blocks. A vertical stack (e.g., 18) is below the upper select gates and has alternating insulative tiers (e.g., 20) and wordline tiers (e.g., 22). Operative channel-material strings (e.g., 49) extend elevationally through the upper select gates and through the insulative tiers and the wordline tiers within the sub-blocks. Dummy channel-material strings (e.g., 90) extend elevationally through the upper select gates and into the insulative tiers and the wordline tiers between the sub-blocks. The dummy channel-material strings individually have a maximum horizontal width (e.g., $W_2$) that is smaller than a maximum horizontal width (e.g., $W_1$) of the individual operative channel-material strings. Any other attribute(s) or aspect(s) as shown and/or described herein with respect to other embodiments may be used.

In one embodiment, a memory array (e.g., 12) comprising strings (e.g., 49) of memory cells (e.g. 56) comprises laterally-spaced memory blocks (e.g., 58) individually comprising sub-blocks (e.g., 59) defined at least in part by laterally-spaced upper select gates (e.g., 83) of individual of the memory blocks. A vertical stack (e.g., 18) is below the upper select gates and has alternating insulative tiers (e.g., 20) and wordline tiers (e.g., 22). Operative channel-material strings (e.g., 49) extend elevationally through the upper select gates and through the insulative tiers and the wordline tiers within the sub-blocks. Dummy channel-material strings (e.g., 90) extend elevationally through the upper select gates and into the insulative tiers and the wordline tiers between the sub-blocks. The operative channel-material strings are taller than the dummy channel-material strings. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The above-described example embodiments may be repeated with or without fabrication of upper select gate tiers and/or lower select gate tiers. Further, multiple stacks 18 may be formed between one or more upper select gate tiers and one or more lower select gate tiers, with the channel and other materials formed in all channel openings in at least two stacks 18 at the same time.

Figure 27:
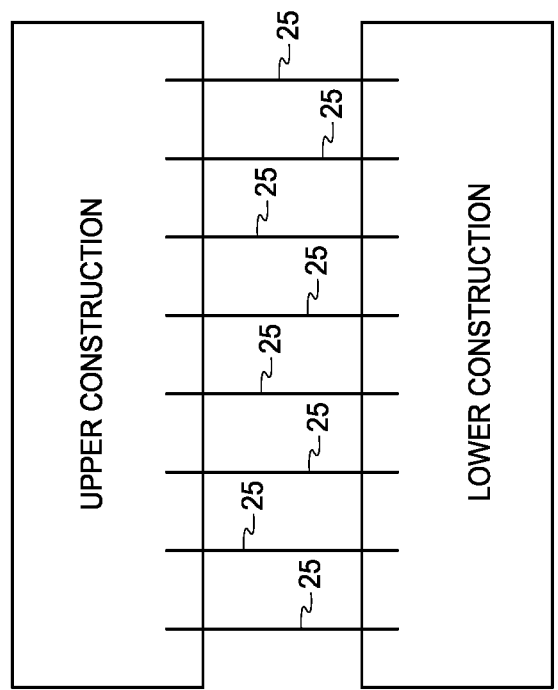
FIG. 27 is a diagrammatic block diagram of a structure in accordance with an embodiment of the invention.

For example, a first-fabricated construction may be a lower construction, an initial stack may be a lower stack, said vertically-alternating insulative tiers and wordline tiers therein may be considered as lower vertically-alternating lower insulative tiers and lower wordline tiers, said array of openings may be considered as a lower array of lower openings, said channel openings may be considered as lower channel openings, said dummy openings may be considered as lower dummy openings, said upper material may be considered as lower-stack upper material, and said lower channel openings may be considered as being etched into the lower insulative and the lower wordline tiers, with the lower channel openings being etched deeper into the lower construction than the lower dummy openings. An example such method further comprises forming an upper construction comprising a stack having vertically-alternating upper insulative tiers and upper wordline tiers. An upper array of upper openings is formed in an uppermost portion of upper-stack upper material that is above the upper stack. The upper openings comprise upper channel openings and upper dummy openings, with the upper channel openings being over the lower channel openings. At least the uppermost portion of the upper-stack upper material is used as a mask while etching the upper channel openings and the upper dummy openings into a lower portion of the upper-stack upper material. The upper channel openings are etched into the upper insulative and the upper wordline tiers to the lower channel openings, and the upper channel openings are etched deeper into the upper construction than the upper dummy openings. The forming of the channel material is into the upper channel openings and into the lower channel openings after the etching of the upper channel openings and the upper dummy openings into a lower portion of the upper-stack upper material. Such is shown diagrammatically in block-diagram form in FIG. 27 where channel openings 25 are extending vertically from and within an upper construction to and within a lower construction. Any other attribute(s) or aspect(s) as shown and/or described herein with respect to other embodiments may be used.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/ conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a construction comprising a stack that have vertically-alternating insulative tiers and wordline tiers. An array of openings is formed in an uppermost portion of upper material that is above the stack, and the openings comprise channel openings and dummy openings. At least the uppermost portion of the upper material is used as a mask while etching the channel openings and the dummy openings into a lower portion of the upper material. The channel openings are etched into the insulative and wordline tiers. The channel openings are etched deeper into the construction than the dummy openings, and channel material is formed in the channel openings after the etching.

In some embodiments, a method used in forming a memory array comprising strings of memory cells, with the memory array comprising laterally-spaced memory blocks individually comprising sub-blocks with upper portions of the sub-blocks being laterally spaced by laterally-spaced upper select gates of individual of the memory blocks, comprises forming a construction comprising a stack that has vertically-alternating insulative tiers and wordline tiers. An array of openings is formed in an uppermost portion of upper material that is above the stack, and the openings comprise channel openings and dummy openings. The channel openings are within the sub-blocks and the dummy openings are within the space that is laterally between neighboring of the sub-blocks. The dummy openings have smaller maximum horizontal-open dimensions than the channel openings. At least the uppermost portion of the upper material is used as a mask while simultaneously etching the channel openings and the dummy openings into a lower portion of the upper material. The channel openings are etched into the insulative tiers and the wordline tiers. The channel openings are etched deeper into the construction than are the dummy openings. Channel material is formed in the channel openings after the etching.

In some embodiments, a memory array comprising strings of memory cells comprises laterally-spaced spaced memory blocks individually comprising sub-blocks defined at least in part by laterally-spaced upper select gates of individual of the memory blocks. A vertical stack is below the upper select gates and has alternating insulative tiers and wordline tiers. Channel-material strings extend elevationally through the upper select gates and through the insulative tiers and the wordline tiers within the sub-blocks. The channel-material strings have a common horizontal pitch within individual of the sub-blocks along parallel horizontally-straight lines between longitudinal edges of the individual memory blocks. The channel-material strings along the parallel horizontally-straight lines are horizontally spaced from one another between immediately-adjacent of the sub-blocks by a distance that is greater than the common horizontal pitch.

In some embodiments, a memory array comprising strings of memory cells comprises laterally-spaced spaced memory blocks. The memory blocks individually comprise sub-blocks defined at least in part by laterally-spaced upper select gates individual of the memory blocks. A vertical stack is below the upper select gates and has alternating insulative tiers and wordline tiers. Operative channel-material strings extend elevationally through the upper select gates and through the insulative tiers and the wordline tiers within the sub-blocks. Dummy channel-material strings extend elevationally through the upper select gates and into the insulative tiers and the wordline tiers between the sub-blocks. The dummy channel material strings individually have a maximum horizontal width that is smaller than a maximum horizontal width of individual of the operative channel-material strings.

In some embodiments, a memory array comprising strings of memory cells comprises laterally-spaced spaced memory blocks. The memory blocks individually comprise sub-blocks defined at least in part by laterally-spaced upper select gates individual of the memory blocks. A vertical stack is below the upper select gates and has alternating insulative tiers and wordline tiers. Operative channel-material strings extend elevationally through the upper select gates and through the insulative tiers and the wordline tiers within the sub-blocks. Dummy channel-material strings extend elevationally through the upper select gates and into the insulative tiers and the wordline tiers between the sub-blocks. The operative channel-material strings are taller than the dummy channel-material strings.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:
1. A memory array, comprising:
laterally-spaced memory blocks, wherein each of the laterally-spaced memory blocks comprises sub-blocks that are defined at least in part by channel openings and laterally-spaced upper select gates and lower select gates on each of the laterally-spaced memory blocks;
an isolation structure that laterally separates immediately adjacent sub-blocks which are defined at least by the laterally-spaced upper select gates;
a dummy channel-material string that extends elevationally above the lower select gates and through the isolation structure;
a vertical stack below the upper select gates having alternating insulative tiers and wordline tiers; and
channel-material strings extending elevationally through the upper select gates and through the insulative tiers and the wordline tiers within the sub-blocks, the channel-material strings having a common horizontal pitch-spacing within individual of the sub-blocks along parallel horizontally-straight lines between longitudinal edges of the individual laterally-spaced memory blocks, the channel-material strings along the parallel horizontally-straight lines being horizontally spaced from one another by the isolation structure between the immediately-adjacent sub-blocks by a distance that is greater than the common horizontal pitch-spacing.

2. The memory array of claim 1 wherein the wordline tiers comprise gate regions of individual memory cells, the gate regions individually comprising part of a wordline in the wordline tiers, the individual laterally-spaced memory blocks being characterized by conducting material of the wordline that extends horizontally continuously from and between the longitudinal edges of the individual laterally-spaced memory blocks.

3. The memory array of claim 1, wherein the isolation structure extends vertically through the insulative tiers and the wordline tiers within and all along the individual laterally-spaced memory blocks.

4. The memory array of claim 1 wherein the elevationally extending dummy channel-material string is formed in a dummy opening between the immediately adjacent sub-blocks.

5. The memory array of claim 4 wherein no portion of the dummy channel-material string formed in the dummy opening is at the same elevation as the laterally-spaced upper select gates.

6. The memory array of claim 4 wherein the dummy channel-material string includes a maximum horizontal width that is smaller than a maximum horizontal width of individual operative channel-material strings that are formed in the channel openings.

7. The memory array of claim 6 wherein the operative channel-material strings are taller than the dummy channel-material string.

8. The memory array of claim 1 further comprising trenches that facilitate formation of conductive materials in the wordline tiers.

9. The memory array of claim 1 wherein the memory array comprises NAND.

10. A memory array, comprising:
laterally-spaced memory blocks, the memory blocks individually comprising sub-blocks that are defined at least in part by laterally-spaced upper select gates and lower select gates on each of the laterally-spaced memory blocks, wherein an isolation structure laterally separates immediately adjacent sub-blocks which are defined at least by the laterally-spaced upper select gates;
a vertical stack below the upper select gates having alternating insulative tiers and wordline tiers;
operative channel-material strings extending elevationally through the upper select gates and through the insulative tiers and the wordline tiers within the sub-blocks, the operative channel-material strings having a common horizontal pitch-spacing within individual of the sub-blocks along parallel horizontally-straight lines between longitudinal edges of the individual laterally-spaced memory blocks, the operative channel-material strings along the parallel horizontally-straight lines being horizontally spaced from one another by the isolation structure between the immediately-adjacent of the sub-blocks by a distance that is greater than the common horizontal pitch-spacing; and
dummy channel-material string extending elevationally through the isolation structure, upper select gates and into the insulative tiers and the wordline tiers between the sub blocks, the dummy channel material string includes a maximum horizontal width that is smaller than a maximum horizontal width of individual of the operative channel material strings.

11. The memory array of claim 10, wherein the operative channel-material strings are taller than the dummy channel-material string.

12. The memory array of claim 10 wherein the memory array comprises NAND.

13. A memory array, comprising:
laterally-spaced memory blocks, the memory blocks individually comprising sub-blocks defined at least in part by laterally-spaced upper select gates and laterally-spaced lower select on each of the laterally-spaced memory blocks;
an isolation structure that laterally separates immediately adjacent sub-blocks which are defined at least by the laterally-spaced upper select gates in an upper construction of each of the laterally-spaced memory blocks;
a vertical stack below the upper select gates having alternating insulative tiers and wordline tiers;
operative channel-material strings extending elevationally through the upper select gates and through the insulative tiers and the wordline tiers within the sub-blocks, the operative channel-material strings along parallel horizontally-straight lines being horizontally spaced from one another by the isolation structure between the immediately-adjacent of the sub-blocks by a distance that is greater than a common horizontal pitch-spacing between the operative channel-material strings within individual of the sub-blocks; and
dummy channel-material string that is formed in individual dummy openings between the immediately adjacent and extending elevationally through the isolation structure, upper select gates, and into the insulative tiers and the wordline tiers between the sub-blocks, the operative channel-material strings being taller than the dummy channel-material string.

14. The memory array of claim 13 wherein the memory array comprises NAND.

* * * * *